(12) United States Patent
Ausserlechner

(10) Patent No.: US 9,606,189 B2
(45) Date of Patent: Mar. 28, 2017

(54) HALL EFFECT SENSOR ARRANGEMENT

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 92 days.

(21) Appl. No.: 14/697,158

(22) Filed: Apr. 27, 2015

(65) Prior Publication Data

US 2015/0346289 A1 Dec. 3, 2015

(30) Foreign Application Priority Data

Apr. 28, 2014 (DE) .................. 10 2014 207 967
May 27, 2014 (DE) .................. 20 2014 004 425 U

(51) Int. Cl.
| | |
|---|---|
| *G01R 33/07* | (2006.01) |
| *H01L 43/06* | (2006.01) |
| *G01R 33/00* | (2006.01) |
| *G01D 5/14* | (2006.01) |
| *H01L 27/22* | (2006.01) |

(52) U.S. Cl.
CPC ......... *G01R 33/0005* (2013.01); *G01D 5/145* (2013.01); *G01R 33/07* (2013.01); *H01L 27/22* (2013.01); *H01L 43/065* (2013.01)

(58) Field of Classification Search
CPC .............................. G01R 33/07; G01D 5/145
USPC ............................... 324/251, 207.2
See application file for complete search history.

(56) References Cited

U.S. PATENT DOCUMENTS 7,782,050 B2 * 8/2010 Ausserlechner ....... G01R 33/07
257/427
8,922,207 B2 * 12/2014 Ausserlechner ....... G01R 33/07
324/251

* cited by examiner

*Primary Examiner* — Reena Aurora
(74) *Attorney, Agent, or Firm* — Schiff Hardin LLP

(57) ABSTRACT

A Hall effect sensor arrangement comprises at least four (2×n) Hall effect components (where n=integer and n≥2), wherein the Hall effect components each have two contact terminals C1, C2 and a signal terminal T1-T4, wherein the contact terminals of the at least four Hall effect components are interconnected with one another such that the at least four Hall effect components are arranged together in a parallel-series interconnection, and comprises a control device 150, which is couplable to the signal terminals T1-T4 of the at least four Hall effect components in a plurality of operating phases such that in the different operating phases at least one of the Hall effect components responds to a first magnetic field component $B_1$ in a first detection direction, and at least another of the Hall effect components responds to a second magnetic field component $B_2$ in a second detection direction, wherein the second detection direction is different than the first detection direction.

27 Claims, 22 Drawing Sheets

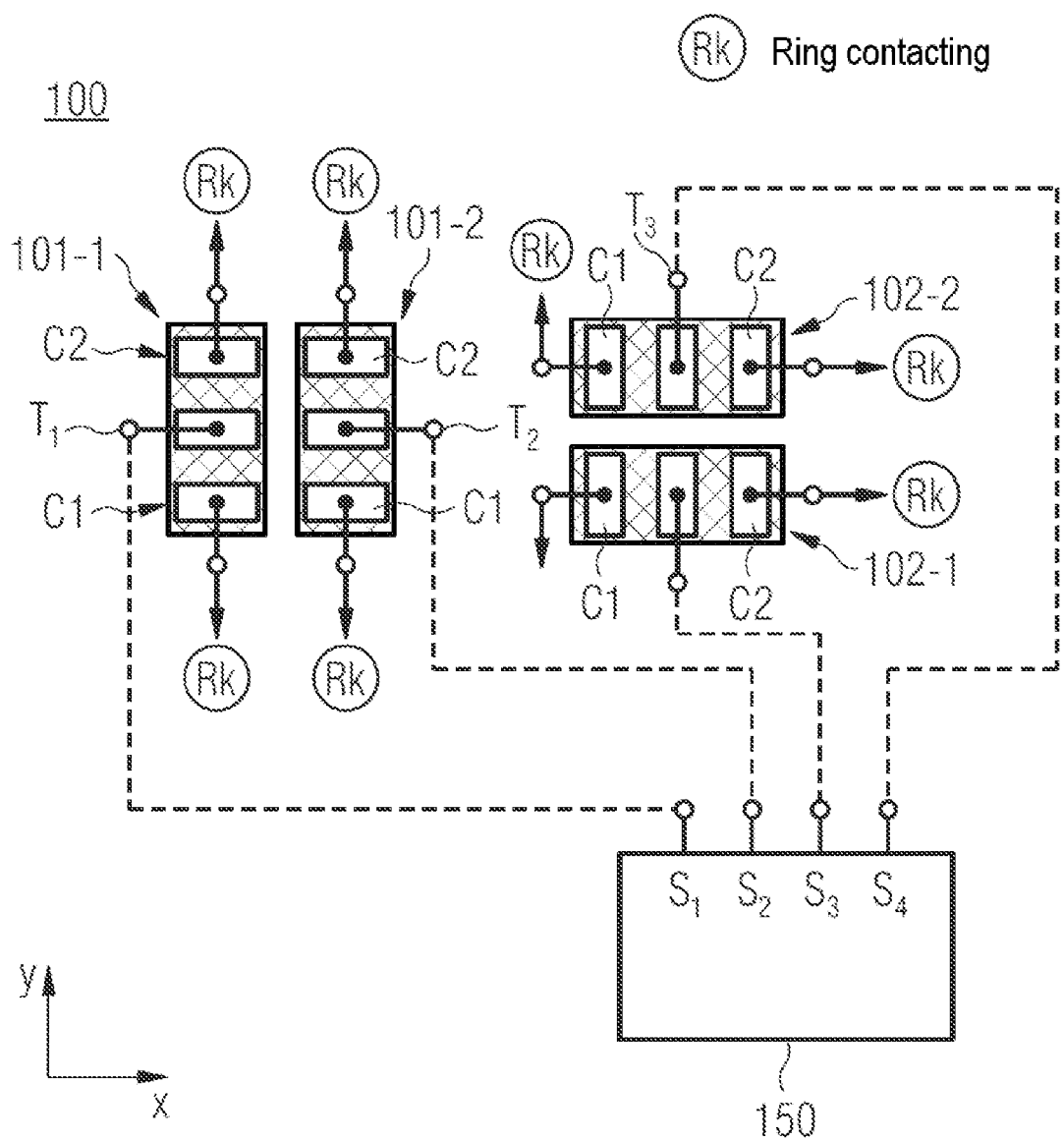

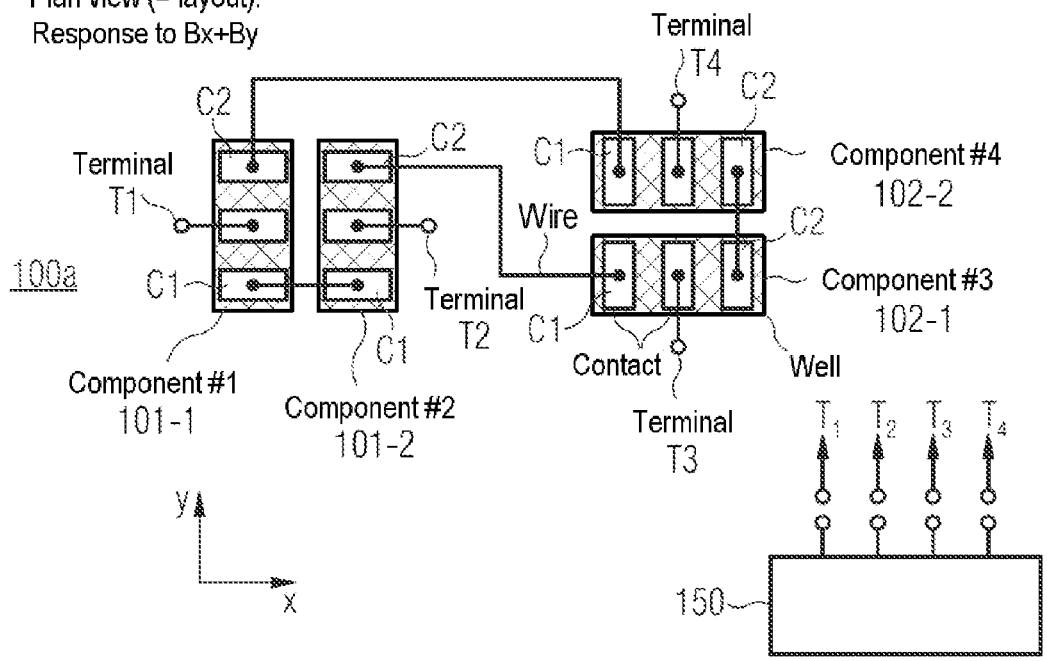
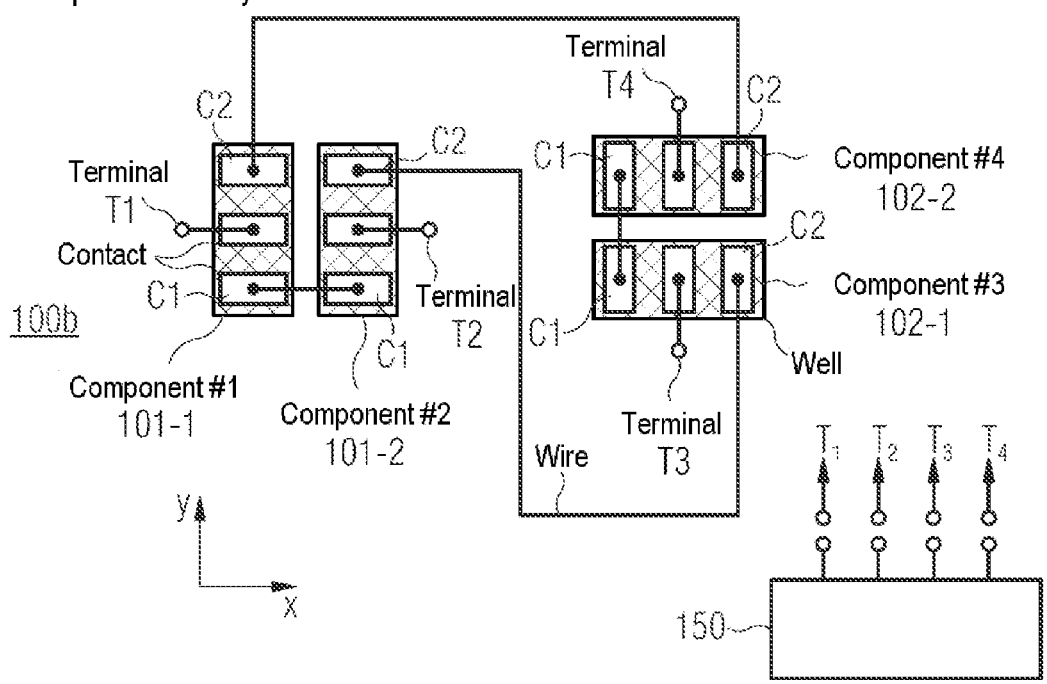

Plan view (= layout):
Response to Bx-By

FIG 7C

Operating phase #1:

| Bx [T] | By [T] | V(T1) | V(T2) | V(T3) | V(T4) | V(T2)-V(T4) |
|---|---|---|---|---|---|---|
| -0.1 | 0 | 1.4015 | 0.7035 | 0 | 0.6730 | 0.0305 |
| 0 | 0 | 1.4016 | 0.7025 | 0 | 0.6741 | 0.0284 |
| 0.1 | 0 | 1.4015 | 0.7014 | 0 | 0.6751 | 0.0263 |
| 0 | -0.1 | 1.4016 | 0.7014 | 0 | 0.6752 | 0.0262 |
| 0 | 0.1 | 1.4016 | 0.7036 | 0 | 0.6730 | 0.0306 |

Operating phase #2:

| Bx [T] | By [T] | V(T1) | V(T2) | V(T3) | V(T4) | V(T2)-V(T4) |
|---|---|---|---|---|---|---|
| -0.1 | 0 | 0.7217 | 1.4186 | 1 | 0.0000 | 0.0263 |
| 0 | 0 | 0.7228 | 1.4186 | 1 | 0.0000 | 0.0284 |
| 0.1 | 0 | 0.7239 | 1.4186 | 1 | 0.0000 | 0.0305 |
| 0 | -0.1 | 0.7239 | 1.4186 | 1 | 0.0000 | 0.0306 |
| 0 | 0.1 | 0.7217 | 1.4186 | 1 | 0.0000 | 0.0262 |

Combination of the two operating phases:

| Bx [T] | By [T] | V(T1)-V(T2)-V(T3)+V(T4))/2 |
|---|---|---|
| -0.1 | 0 | -0.00212 |
| 0 | 0 | 0.00000 |
| 0.1 | 0 | 0.00212 |
| 0 | -0.1 | 0.00217 |
| 0 | 0.1 | -0.00217 |

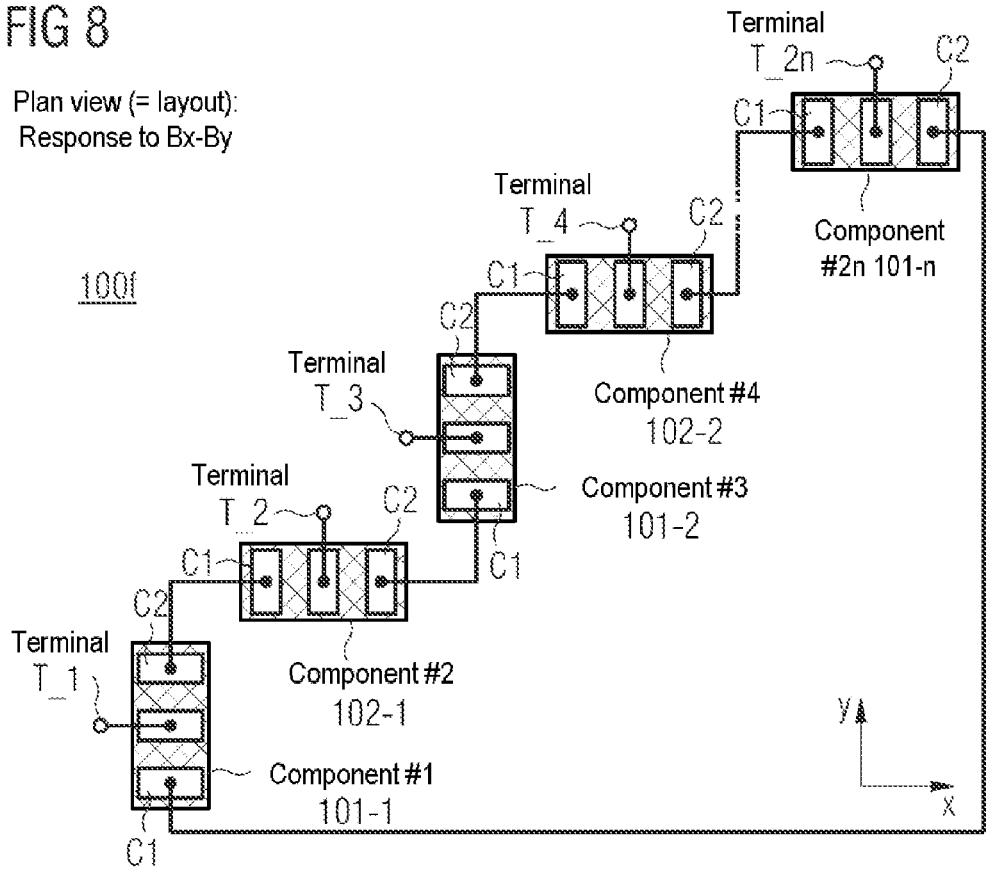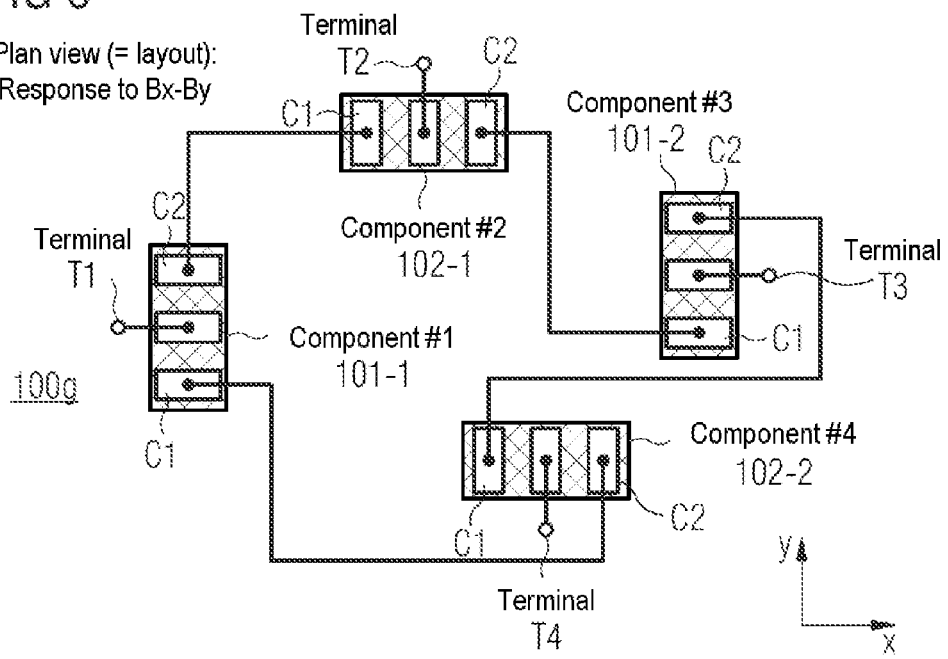

Plan view (= layout):
Response to Bx-By

Plan view (= layout):
Response to dBx/dx+dBy/dx

Plan view (= layout):
Response to Bx-By

Plan view (= layout):
Response to Bx-By

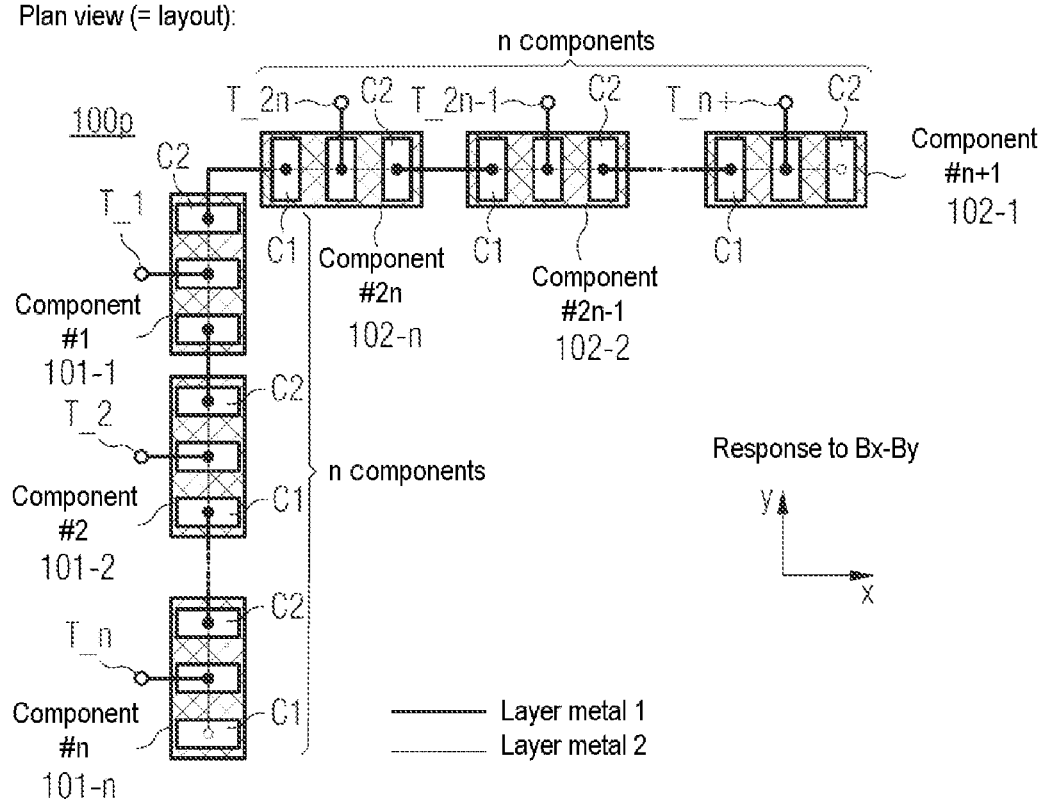

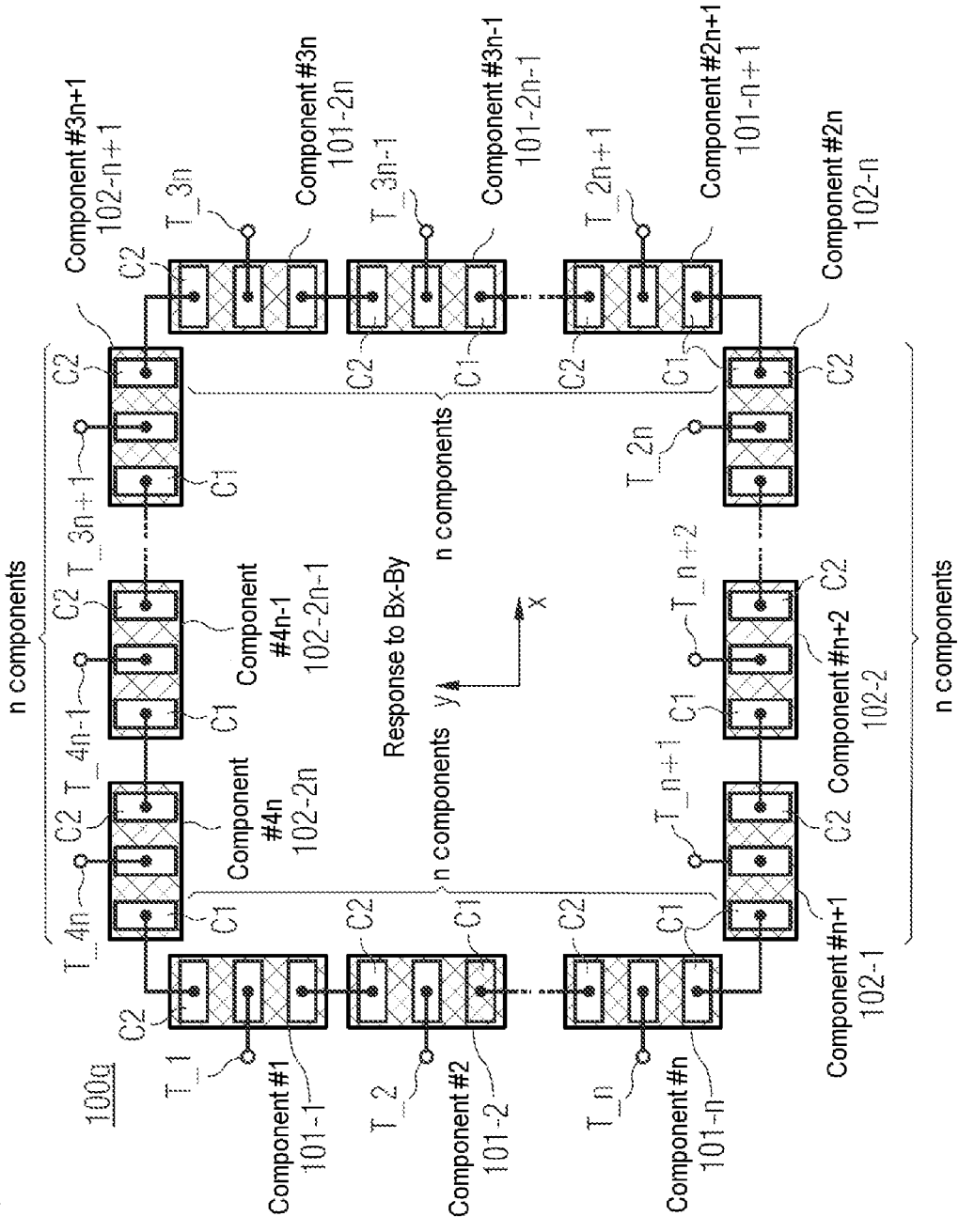

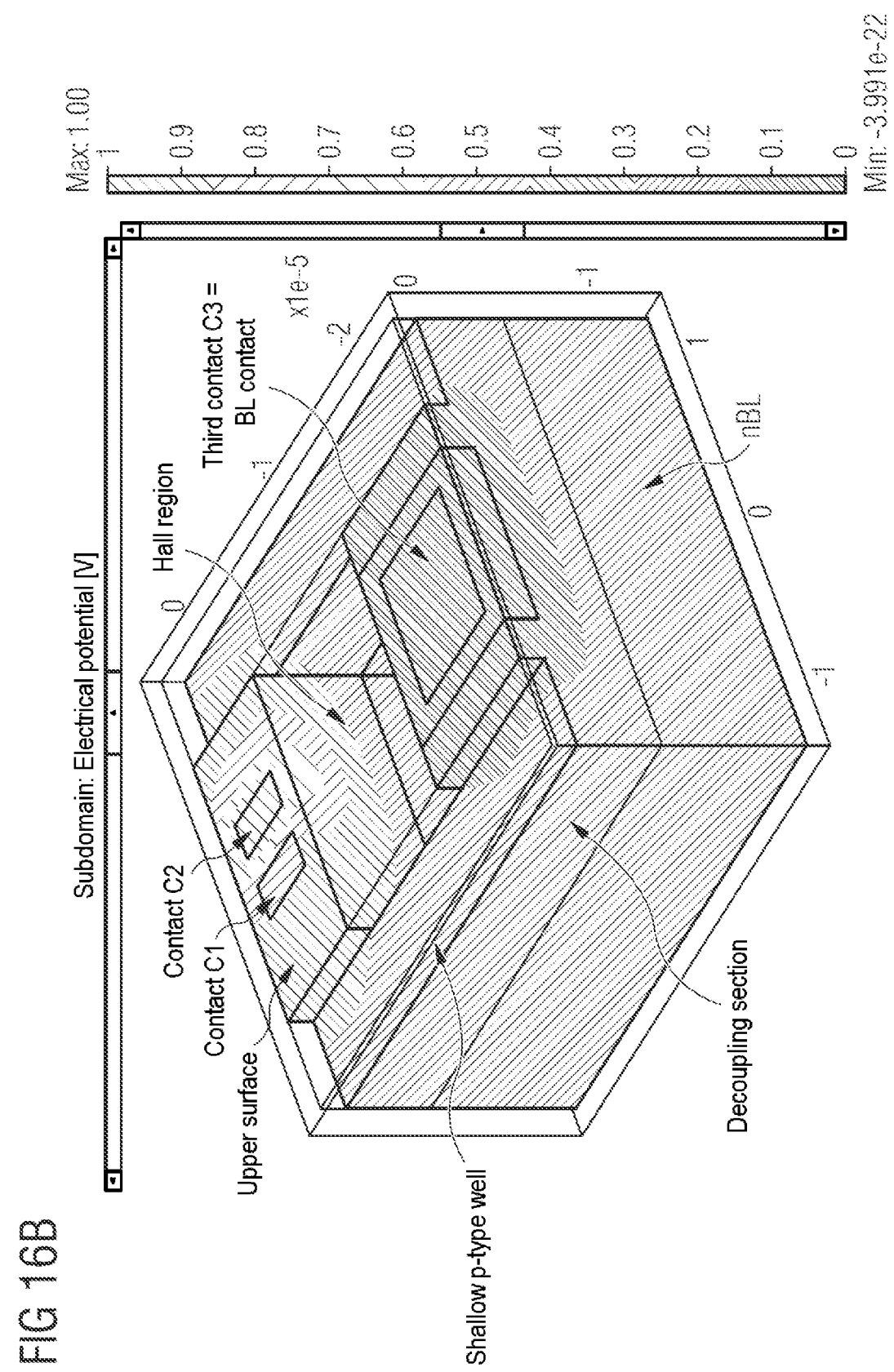

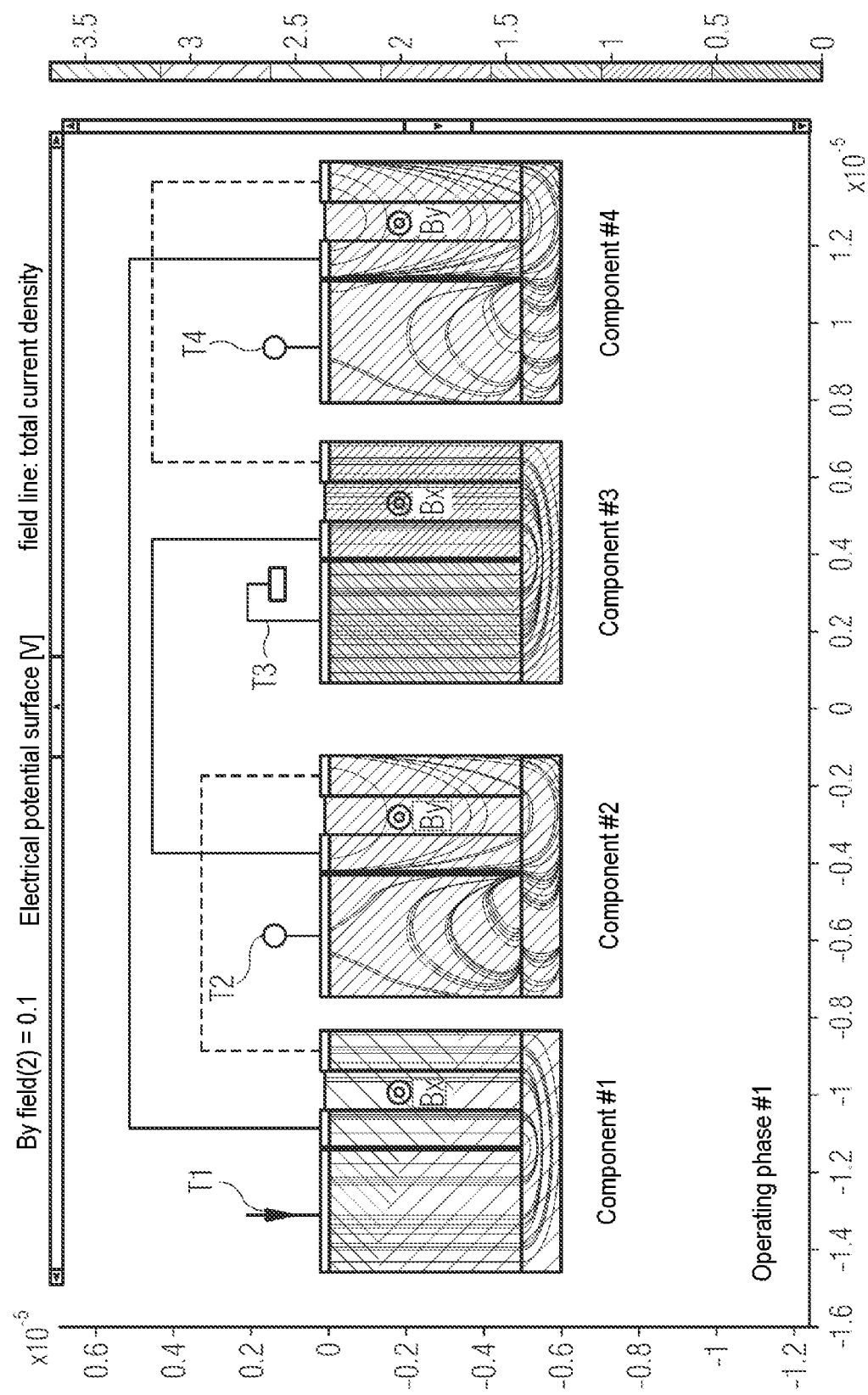

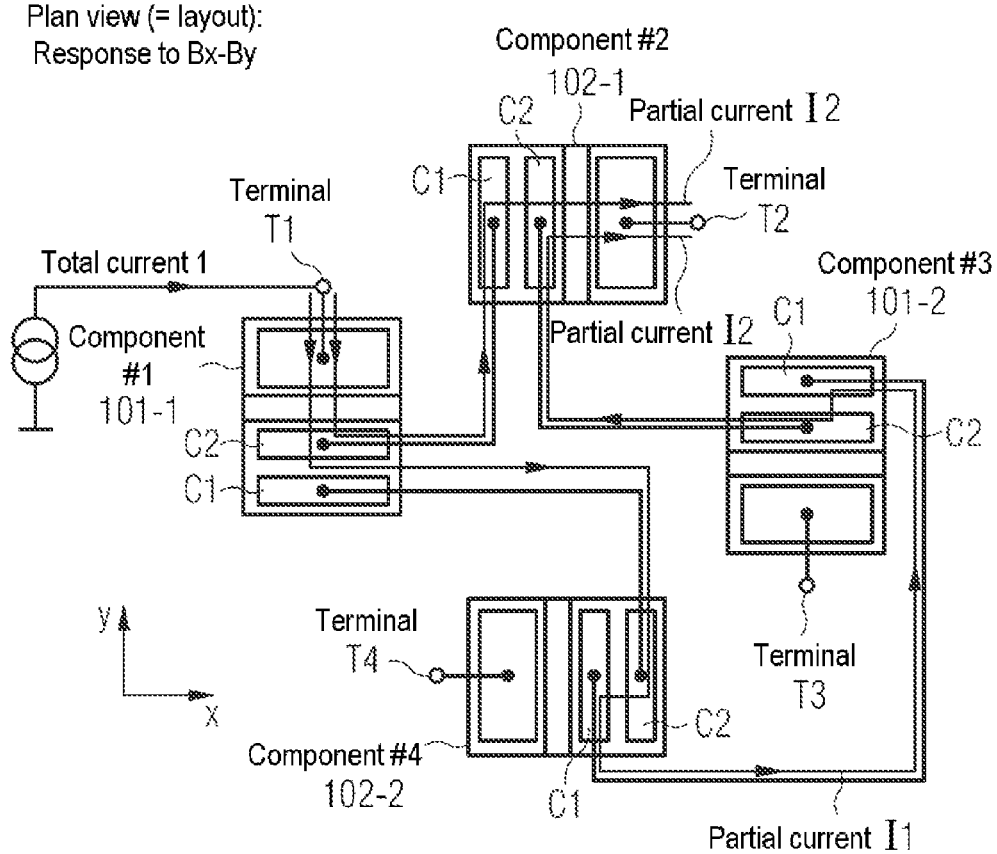

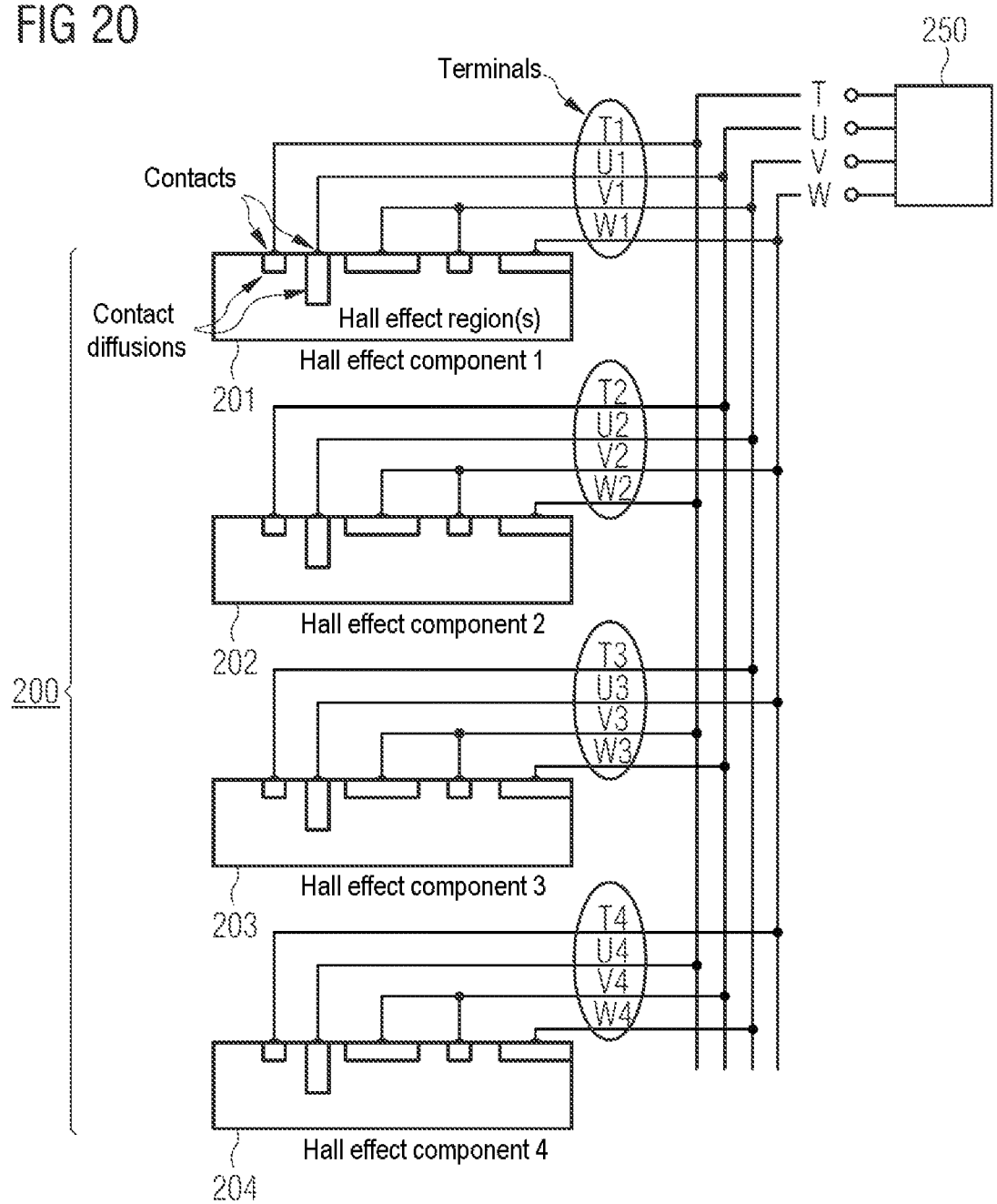

FIG 21
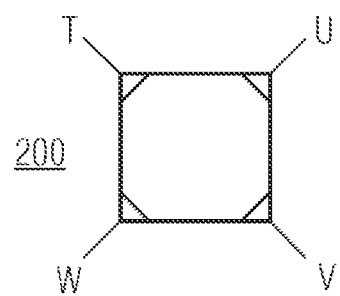
FIG 22A
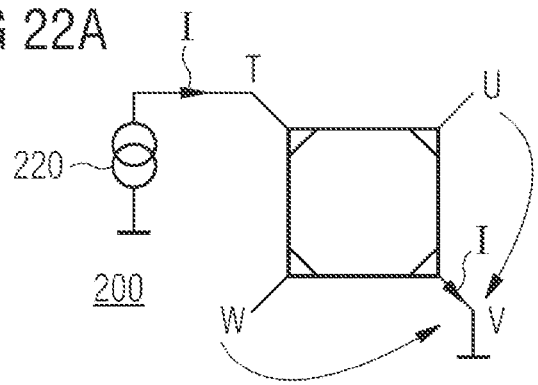
FIG 22B
FIG 23
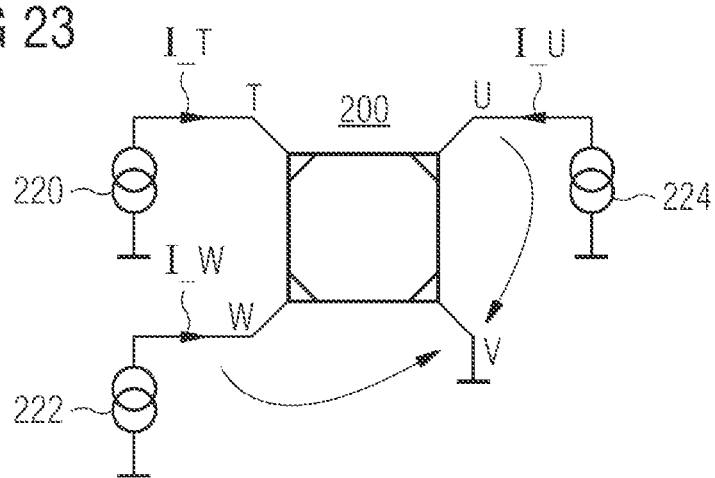

HALL EFFECT SENSOR ARRANGEMENT

Exemplary embodiments of the present invention relate to Hall effect sensor arrangements and in particular to Hall effect sensor arrangements comprising orthogonal, ring-interconnected, vertical 3C Hall effect sensor elements (3C=three contact terminals), and to Hall effect sensor elements comprising a symmetrical, vertical Hall effect component.

Hall effect components or Hall effect sensor elements consist of one or a plurality of Hall effect regions having supply terminals and signal terminals. The Hall effect takes place in the Hall effect regions, the Lorentz force of the magnetic field on the mobile charge carriers leading to an electric Hall field in said regions. The mobile charge carriers are fed by an electrical power source connected to the supply terminals. The output signal of the Hall effect component can be tapped off at the signal terminals. All the contact terminals (supply and signal terminals) are ohmic contacts, such that the Hall effect component is taken to be a purely resistive component.

The object of the present invention is to provide an improved Hall effect sensor arrangement comprising a plurality of Hall effect components which is drivable with a spinning signal scheme (spinning current scheme or spinning voltage scheme) in order to reduce the residual offset, while the current consumption of the arrangement is as low as possible and the magnetic sensitivity of the sensor arrangement is as high as possible.

The object is achieved by means of the features of the independent patent claims.

Developments are presented in the dependent patent claims.

Exemplary embodiments of the present invention afford a Hall effect sensor arrangement, comprising at least four (2×n) Hall effect components (where n=integer and n≥2), wherein the Hall effect components each have two contact terminals and a signal terminal, wherein the contact terminals of the at least four Hall effect components are interconnected with one another such that the at least four Hall effect components are arranged together in a parallel-series interconnection, and comprising a control device, which is couplable to the signal terminals of the at least four Hall effect components in a plurality of operating phases such that in the different operating phases at least one of the Hall effect components responds to a first magnetic field component $B_1$ in a first detection direction, and at least another of the Hall effect components responds to a second magnetic field component $B_2$ in a second detection direction, wherein the second detection direction is different than the first detection direction.

Further exemplary embodiments of the present invention furthermore afford a Hall effect sensor arrangement, comprising a first Hall effect component, which is formed by a first electrically conductive region extending into a substrate perpendicularly to the surface of the substrate and has a plurality of terminal regions along a side face at the surface of the substrate, comprising at least one second, identically constructed Hall effect component interconnected with the first Hall effect component, such that during operation of the Hall effect sensor arrangement with a spinning current technique on the assumption of an identical control current in the different spinning current operating phases, in each spinning current operating phase the same combination of control current distributions is obtained in the Hall effect sensor arrangement, wherein the first Hall effect component and the second Hall effect component each have 2×b (where b>2) contact terminals; and comprising a control device which is couplable to the contact terminals of the first and second Hall effect components such that during the different spinning current operating phases of successive spinning current operating cycles the four contact terminals are each active alternately in pairs as control terminals and measurement terminals, wherein the control device is furthermore designed, during at least one (predefined) spinning current operating phase in each respective m-th (where m=1 to 1000) successive operating cycle, to drive the respective pairs of control and measurement terminals such that during these predefined spinning current operating phases the respective current flow through the control terminals is different, and the resultant additional current flows through the measurement terminals are nominally identical (and thus compensate for the current flow difference in the control terminals).

Preferred exemplary embodiments of the present invention are explained in greater detail below with reference to the accompanying drawings, in which:

FIG. 1 shows a schematic basic illustration of a Hall effect sensor arrangement comprising four (2n, where n=2) Hall effect components and a control device in a plan view in accordance with one exemplary embodiment;

FIGS. 2A-B show a schematic 3D view of an individual vertical Hall effect component and an associated electrical equivalent circuit diagram;

FIG. 3 shows a schematic basic illustration of a Hall effect sensor arrangement in a plan view in accordance with a further exemplary embodiment;

FIG. 4 shows a schematic basic illustration of a Hall effect sensor arrangement in a plan view in accordance with a further exemplary embodiment;

Figure 5A:
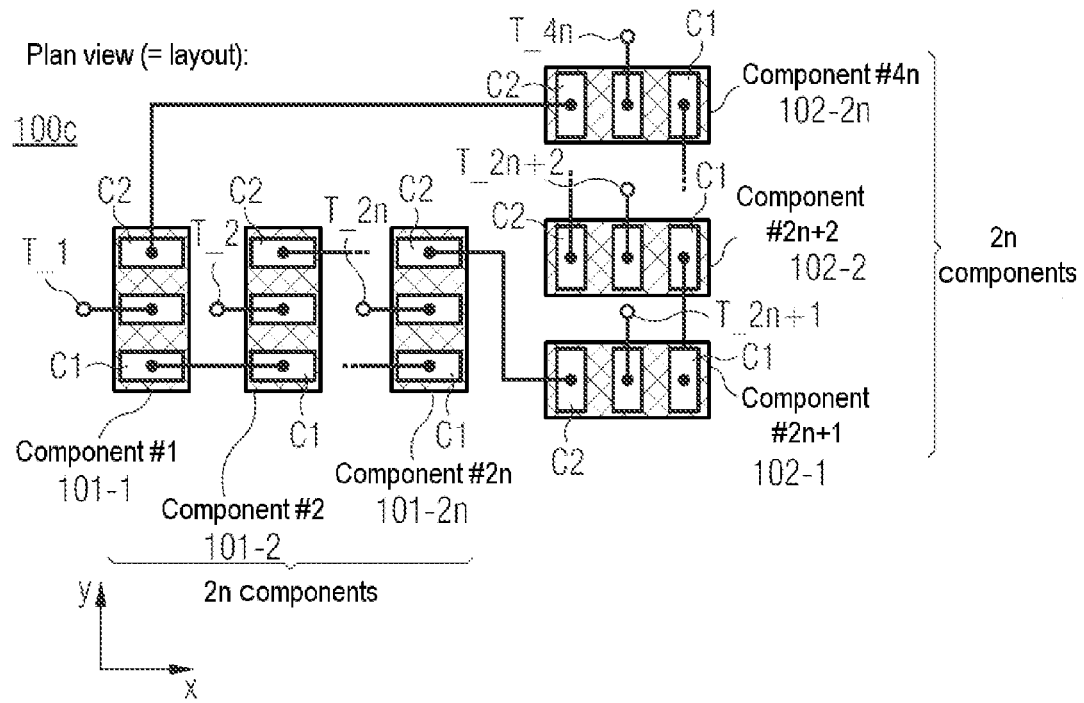
Figure 5B:
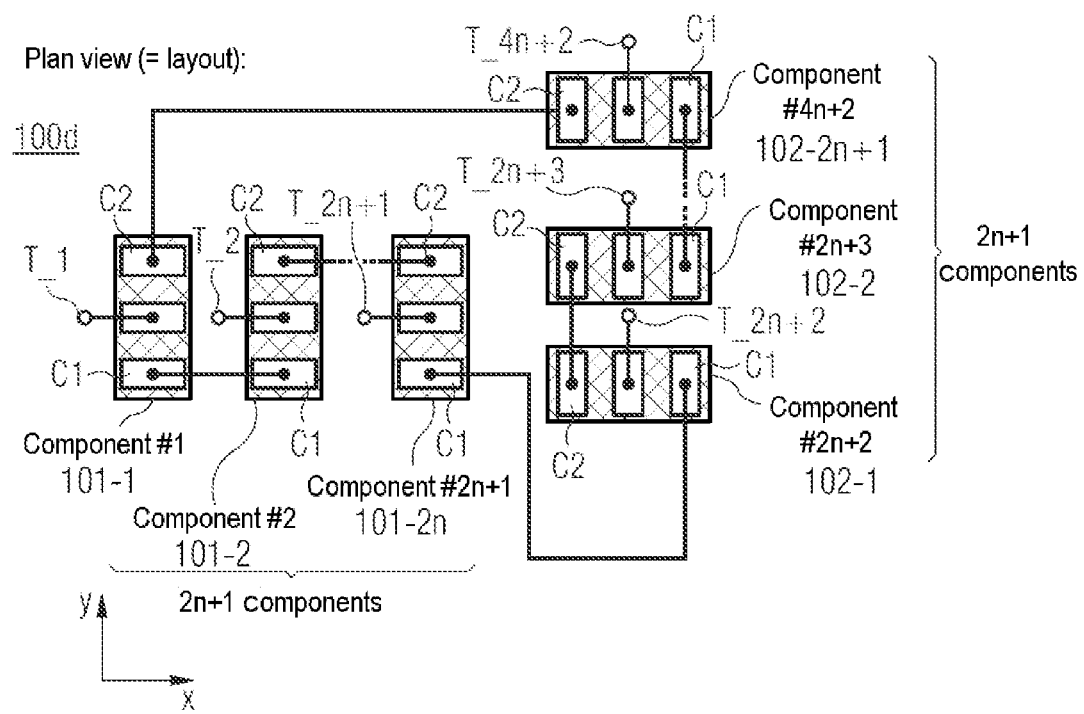
Figure 6:
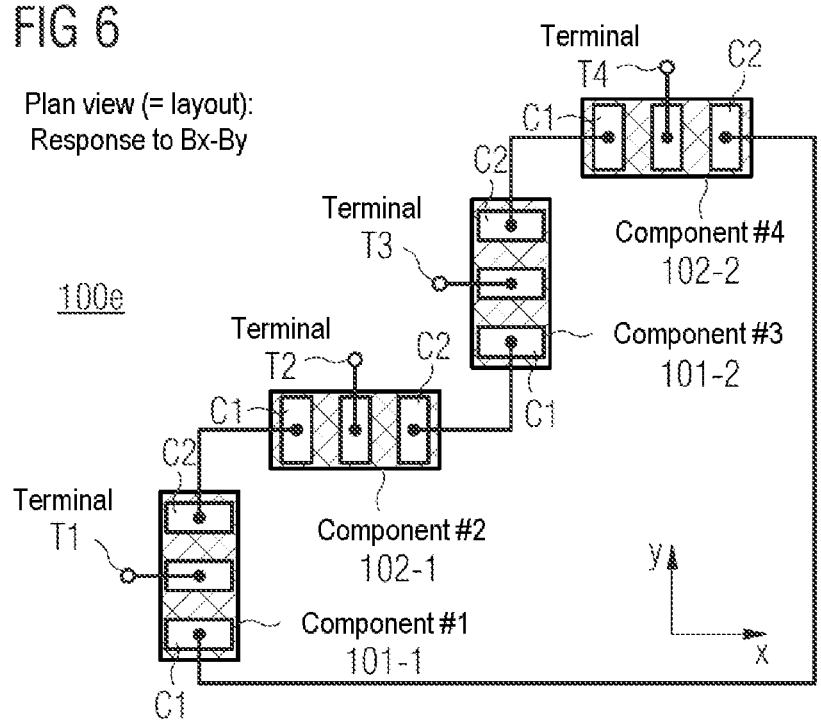
Figure 7A:
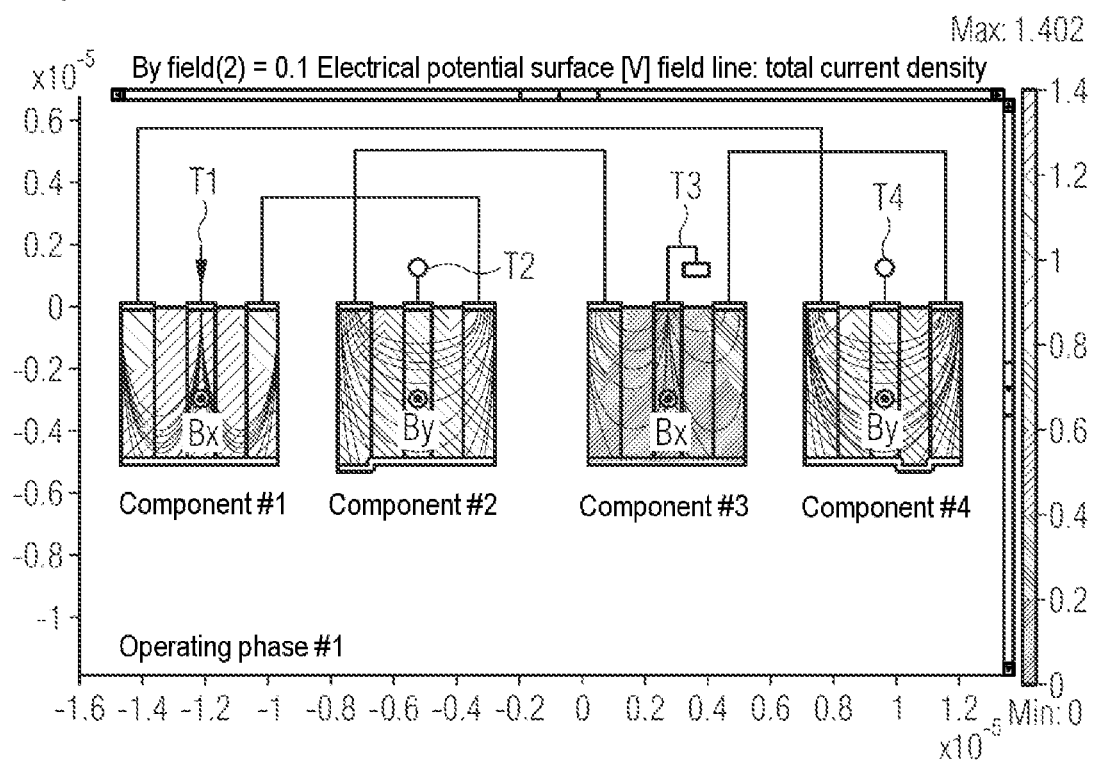
Figure 7B:
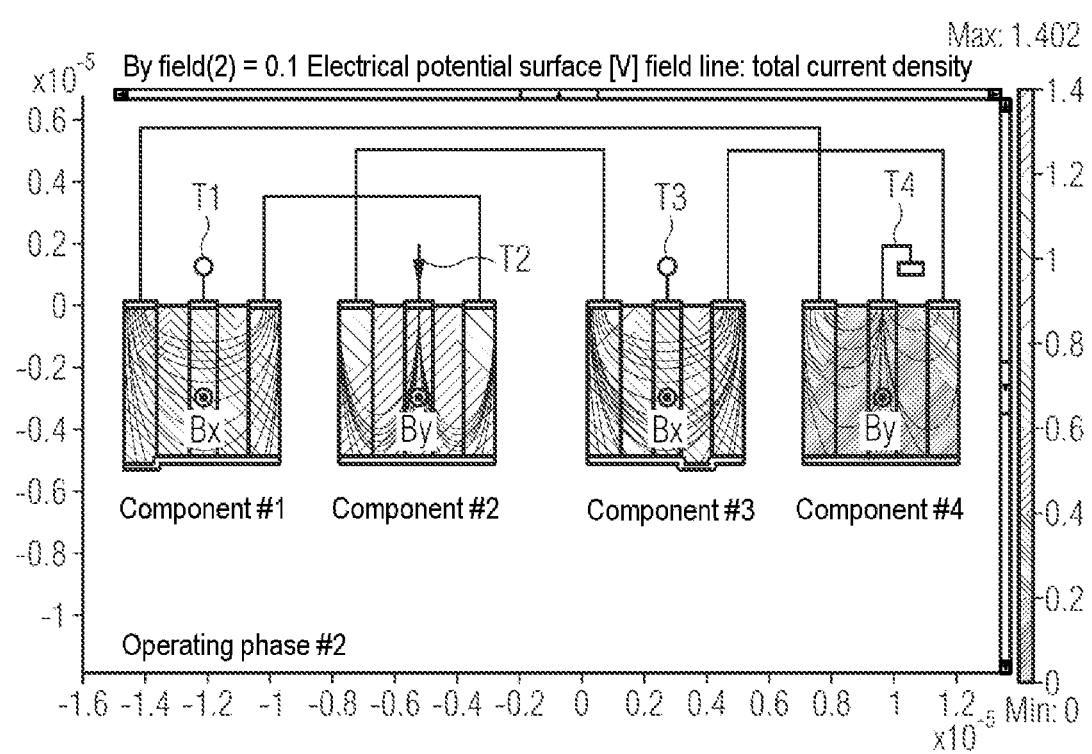
Figure 10:
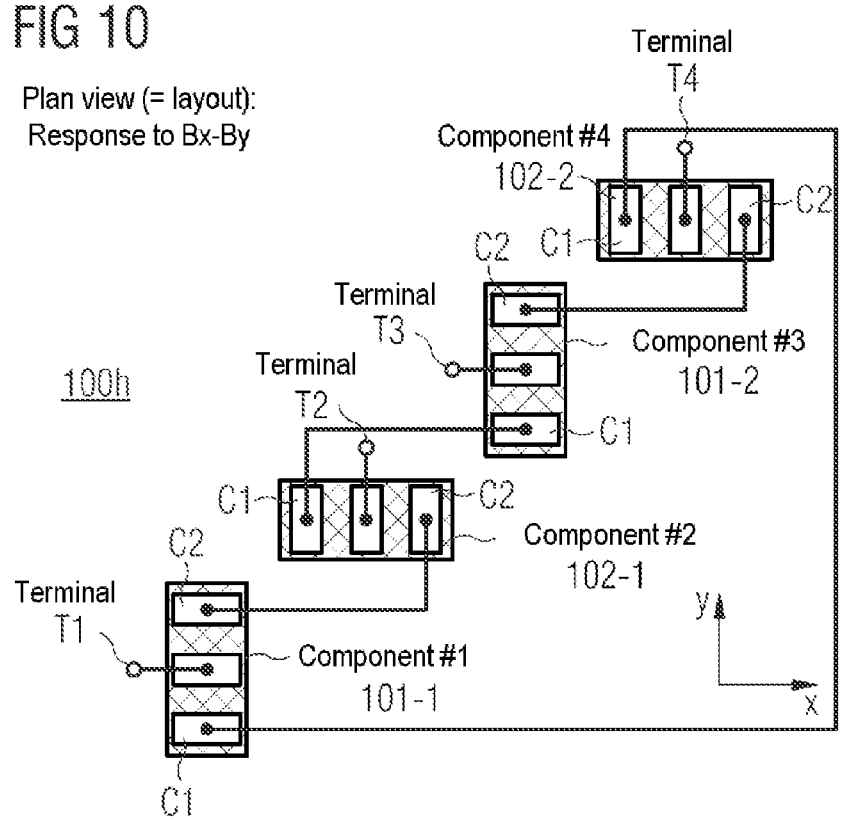
Figure 11:
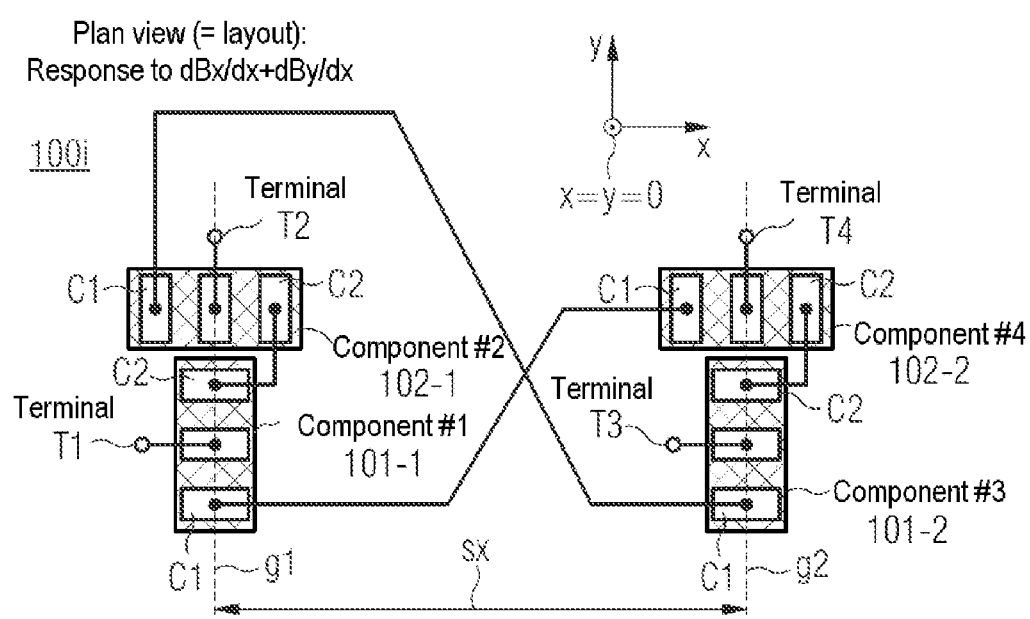
Figure 12:
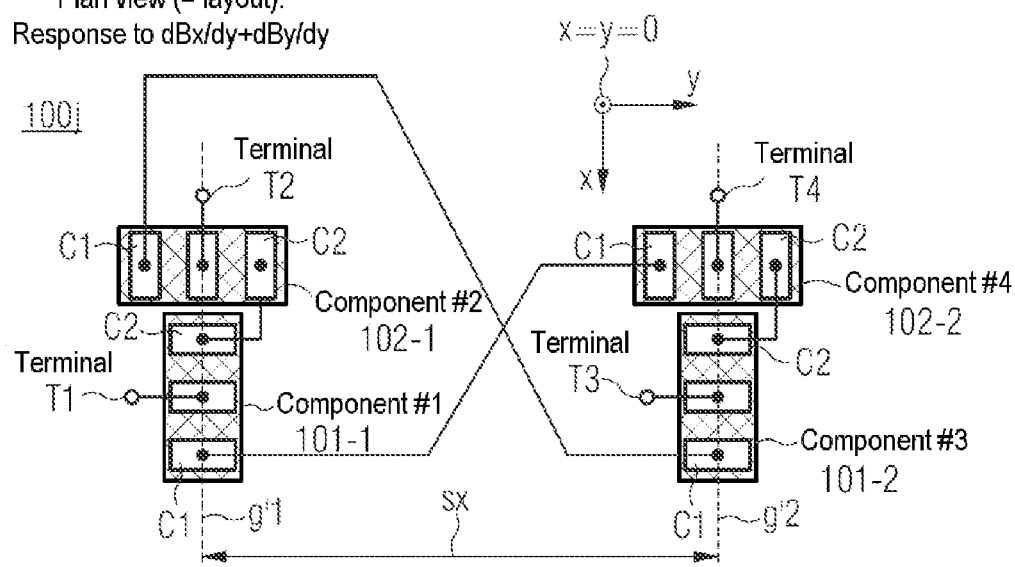
Figure 13:
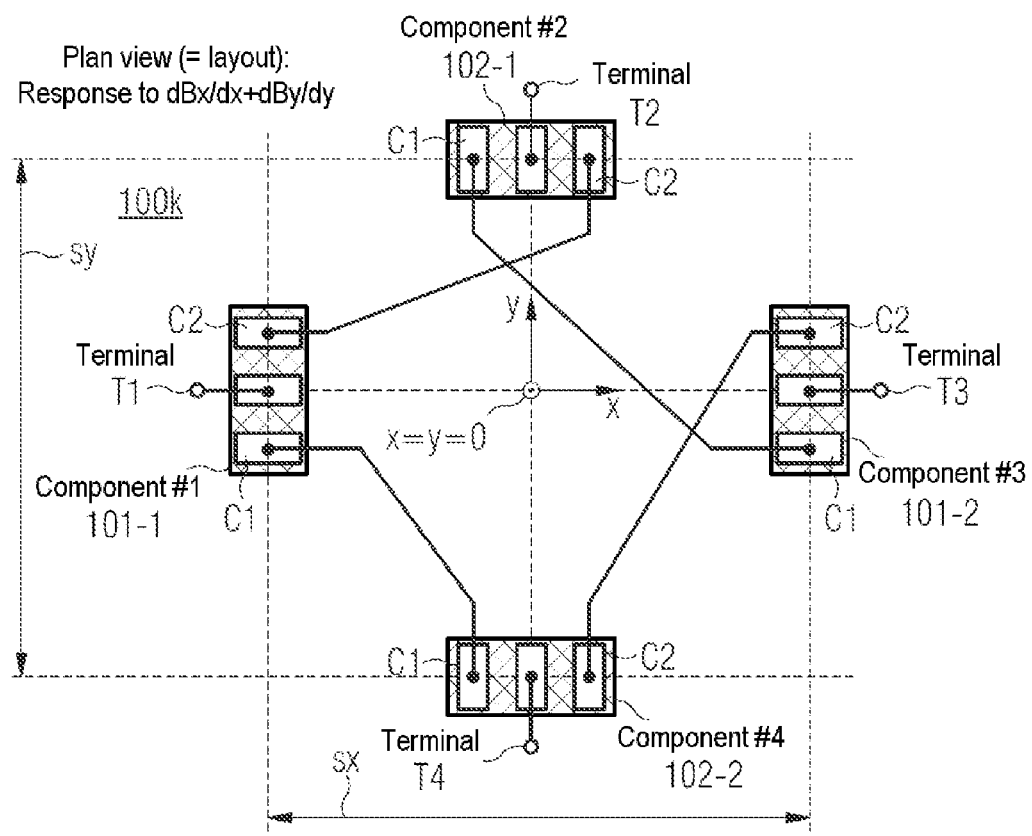
Figure 14:
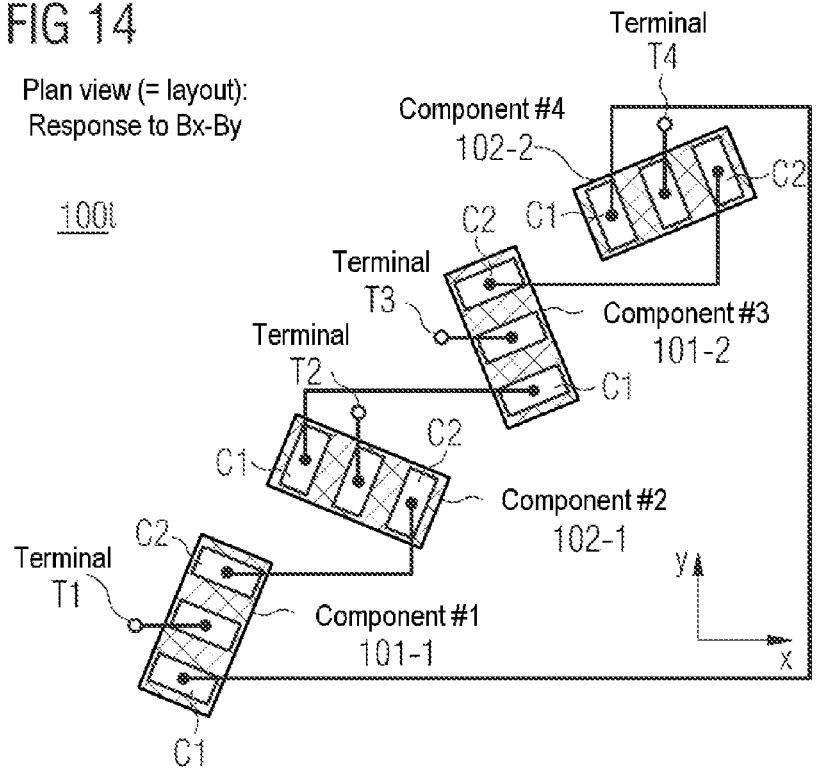
Figure 16A:
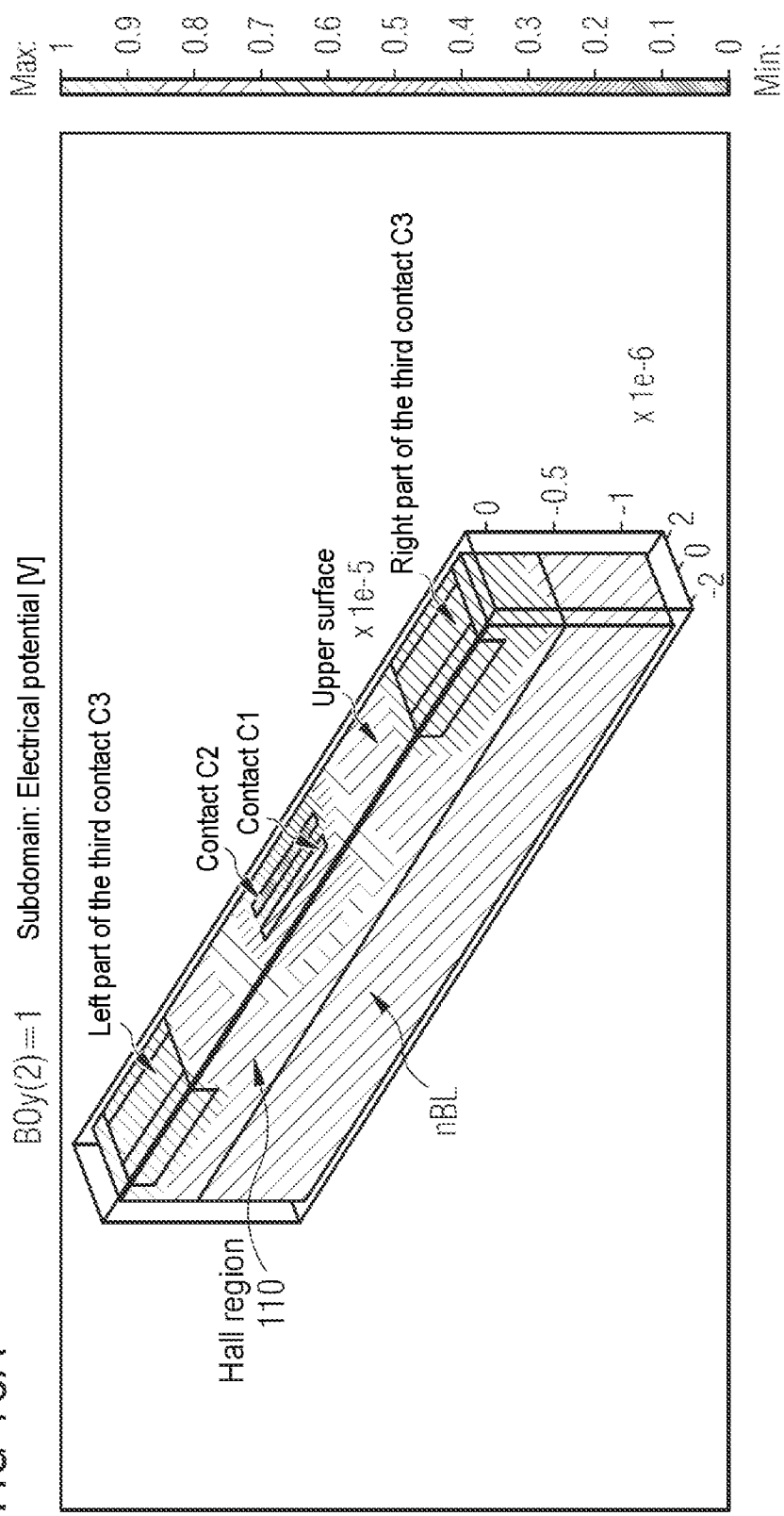
Figure 17A:
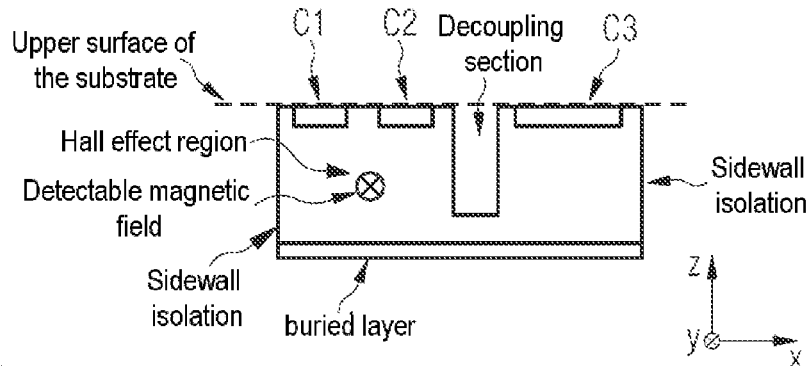
Figure 17B:
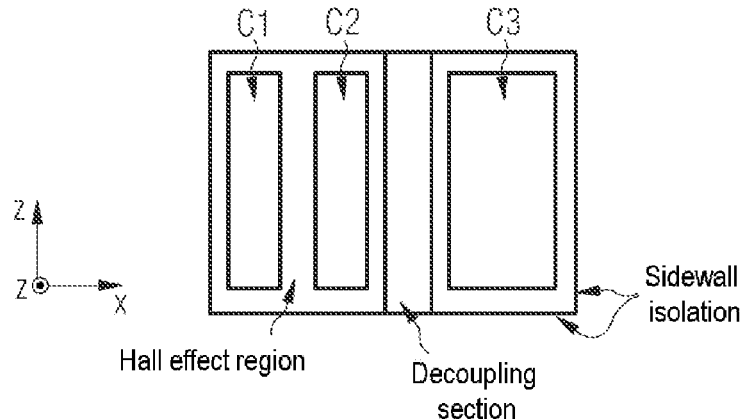
Figure 18A:
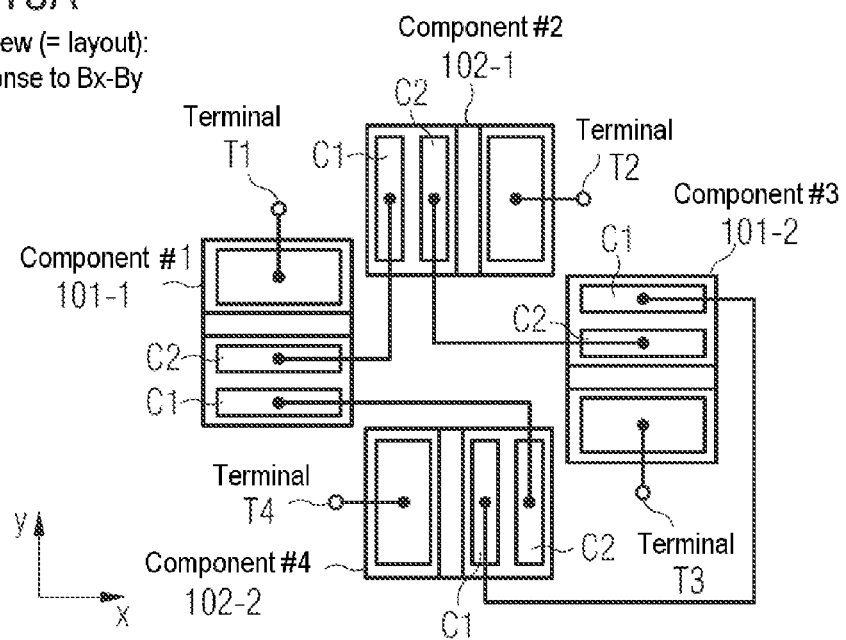
Figure 18C:
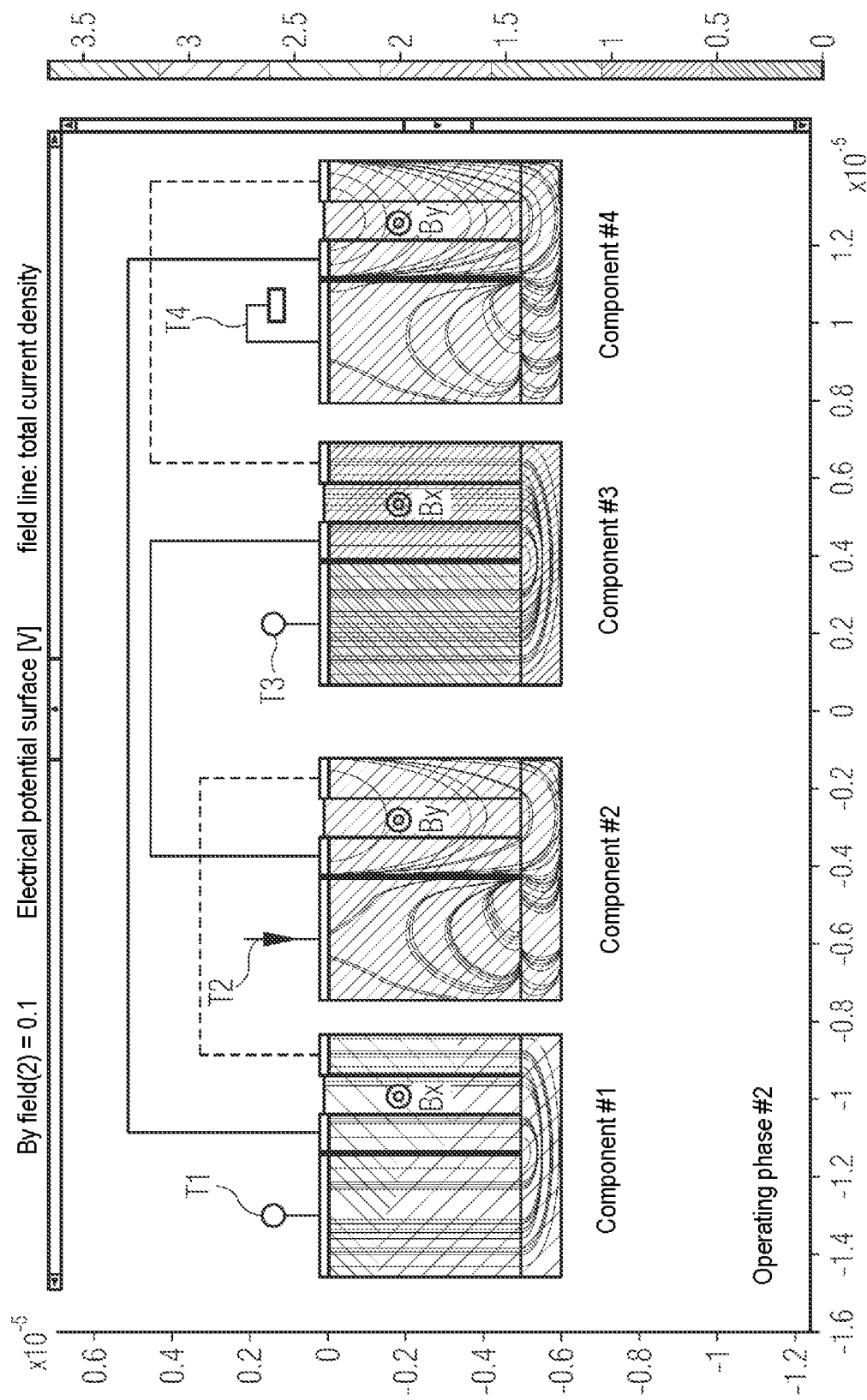

FIGS. 5A-B show schematic basic illustrations of Hall effect sensor arrangements in a plan view in accordance with a further exemplary embodiment;

FIG. 6 shows a schematic basic illustration of a Hall effect sensor arrangement in a plan view in accordance with a further exemplary embodiment;

FIGS. 7A-C show a simulated illustration of the current profiles in the Hall effect components of the Hall effect sensor arrangement from FIG. 6 in different operating phases (in accordance with a numerical simulation);

FIG. 8 shows a schematic basic illustration of a Hall effect sensor arrangement in a plan view in accordance with a further exemplary embodiment;

FIG. 9 shows a schematic basic illustration of a Hall effect sensor arrangement in a plan view in accordance with a further exemplary embodiment;

FIG. 10 shows a schematic basic illustration of a Hall effect sensor arrangement in a plan view in accordance with a further exemplary embodiment;

FIG. 11 shows a schematic basic illustration of a Hall effect sensor arrangement in a plan view in accordance with a further exemplary embodiment;

FIG. 12 shows a schematic basic illustration of a Hall effect sensor arrangement in a plan view in accordance with a further exemplary embodiment;

FIG. 13 shows a schematic basic illustration of a Hall effect sensor arrangement in a plan view in accordance with a further exemplary embodiment;

FIG. 14 shows a schematic basic illustration of a Hall effect sensor arrangement in a plan view in accordance with a further exemplary embodiment;

FIGS. 15A-D show schematic basic illustrations of Hall effect sensor arrangements in a plan view in accordance with further exemplary embodiments;

FIGS. 16A-B show a schematic three-dimensional view of a vertical Hall effect region and the electrical potential therein, which is obtained by a numerical simulation during a specific clock phase of a spinning current scheme, and a schematic three-dimensional view of a vertical Hall effect component having a pair of contacts and an opposite surface node contact;

FIGS. 17A-B show a cross-sectional view and a plan view of the vertical Hall effect element from FIGS. 16A-B;

FIGS. 18A-C show a schematic basic illustration of a further Hall effect sensor arrangement in a plan view and associated different current distributions in different operating phases of the individual Hall effect components (in accordance with a numerical simulation) in accordance with a further exemplary embodiment;

FIG. 19 shows a schematic basic illustration of a further Hall effect sensor arrangement in plan view in accordance with a further exemplary embodiment;

FIG. 20 shows a schematic basic illustration of a Hall effect sensor arrangement comprising four interconnected Hall effect components in a cross-sectional illustration;

FIG. 21 shows a schematic basic illustration of a Hall effect sensor arrangement comprising four contact terminals which results from FIG. 20;

FIGS. 22A-B show a schematic basic illustration of a Hall effect sensor arrangement in a first and second operating state; and FIG. 23 shows a schematic basic illustration of a further Hall effect sensor arrangement in accordance with a further exemplary embodiment.

In the following description of the exemplary embodiments of the present invention, in the figures and the description identical and identically acting elements are provided with the same reference signs, such that the description of identical or identically acting elements having the same reference signs is mutually interchangeable in the different exemplary embodiments.

The following description sets out a plurality of details in order to afford a more thorough explanation of exemplary embodiments of the teachings disclosed herein. However, it will become clear to those skilled in the art that exemplary embodiments of the teachings disclosed herein can be implemented without these specific details. Features of the various exemplary embodiments described in accordance therewith can be combined with one another, unless specifically indicated otherwise. The terms "Hall effect region" and "well" are usually used interchangeably herein. Accordingly, a Hall effect region can be a well of a first conductivity type which is embedded in a substrate, or a well of the opposite conductivity type. This structure can bring about an electrical isolation of the well from the substrate, particularly if the resulting pn junction is reverse-biased. However, it can also be possible that a well has two or more Hall effect regions, particularly if two or more relatively pronounced current flows can be generated in the Hall effect region (as a result of which a certain isolation of the two Hall effect regions is effectively brought about).

If the electronic device has two or more Hall effect regions, the latter can be isolated from one another. The electrical isolation of two Hall effect regions from one another can have a number of forms. In accordance with one form of isolation, the two or more Hall effect regions are isolated from one another e.g. by a material, e.g. an insulator (oxide), which is not the material of the Hall effect region.

In one exemplary embodiment, the Hall effect region can be an n-doped semiconductor since this yields a mobility three times higher and hence a higher Hall factor than with a p-doped semiconductor. The doping concentration in the functional part of the Hall effect region in one exemplary embodiment is usually in the range of $10^{15}$ cm$^{-3}$ to $10^{17}$ cm$^{-3}$.

The teachings disclosed herein are related to the use of the spinning current principle, in which supply and detection terminals are interchanged in successive clock phases/operating phases. A detection terminal in the case of a vertical Hall device responds to an electric current passing below said device. A magnetic field (which is parallel to the chip surface and perpendicular to the current flow lines) can efficiently raise or lower the potential at the contact (which usually lies at the surface of the chip).

It is thus conceivable that the term "vertical Hall effect" or "vertical Hall device" is derived from the fact that the Hall effect acts in a vertical direction in the case of a vertical Hall device (if it is assumed by definition that the surface of the substrate is horizontal). Contacts at the end of a well (or a semiconductor Hall effect region) are not usually subjected to current flow lines passing below them, or are subjected to said current flow lines only to a negligible extent. Therefore, contacts at the ends of a well are usually used as detection contacts less frequently.

The electronic devices in accordance with the teachings disclosed herein usually (but not necessarily) use a substantially horizontal current mode.

The Hall effect regions are formed in a manner isolated from one another (for example in the same substrate, wherein they have an isolating structure or at least a substantially current-free region between them, or in two separate substrates), but they are electrically connected to a ring and thus form a ring structure. An electric current enters the ring structure at a first supply contact and leaves the ring structure at a second supply contact. On account of the ring structure, two current paths are available for the electric current between the first supply contact and the second supply contact. The two current paths begin at the first supply contact and combine at the second supply contact.

A spinning current scheme can be used, in particular, if the electronic device is a vertical Hall effect device. During the implementation of a cycle of the spinning current scheme, a first ring is formed during a first operating phase of the spinning current cycle and a second ring is formed during a second operating phase of the spinning current cycle. The current lines therefore assume a ring-shaped arrangement, wherein in the spinning current method the ring interconnection remains fixed in all phases, i.e. the topological ring thus remains identical, and only the feeding-in and coupling-out points change. The two rings of the two operating phases differ in particular with regard to the contacts at which the electric current enters the ring and leaves the latter.

The proposed ring connection (ring circuit) differs from a parallel circuit formed by two or more Hall effect regions, as will be explained below. In the case of a parallel circuit, two or more nodes of one Hall effect region are electrically connected to two or more corresponding nodes of the other Hall effect region. In this way, the electrical potential is formed at these nodes between the two or more Hall effect regions. The two or more Hall effect regions of a parallel-connected configuration are not part of a common main current path; i.e. an electric current fed to the first Hall effect region at a first supply contact does not principally flow through the second Hall effect region, but rather leaves the first Hall effect region usually at a second supply contact with substantially the same magnitude.

In contrast thereto, in the case of the ring connection proposed herein, a total electric current within one of the Hall effect regions, i.e. that Hall effect region in which or on the surface of which the first supply contact is presently formed, is divided into two parts. The parts of the total electric current flow to at least one further Hall effect region. The parts of the total electric current subsequently flow through the at least one further Hall effect region and finally combine before they leave the ring structure at the second supply contact. In this way, the part of the total electric current which leaves one of the Hall effect regions via the first contract or the second contact of the Hall effect region enters the other Hall effect region, such that both Hall effect regions have e.g. the same part of the total electric current at the contact via which the connection is effected. As will be shown below in exemplary embodiments, in the case of a ring circuit the current between coupling-in and coupling-out points is divided into exactly two parts, which flow on different paths from the coupling-in point to the coupling-out point (apart from these two points, the paths have no overlap region/point).

FIG. 1 shows a schematic basic illustration of a Hall effect sensor arrangement 100 comprising for example four (2×n, where n=2) Hall effect components (also: Hall effect sensor elements) 101-1, 101-2 and 102-1, 102-2. Each of said Hall effect components 101-1, 101-2 and 102-1, 102-2 has for example a respective Hall effect region (cf. FIG. 2a, the semiconductor region 110 above the buried n$^+$-type layer=nBL=nBuried Layer), wherein in each case three contact regions are formed in the semiconductor material (semiconductor substrate). The first Hall effect component 101-1 has two contact terminals C1 and C2 and a signal terminal T1. The second Hall effect component 101-2 likewise has two contact terminals C1 and C2 and a signal terminal T2. The third Hall effect component 102-1 correspondingly has two contact terminals C1 and C2 and the signal terminal T3. Equally, the fourth Hall effect component 102-2 has two contact terminals C1 and C2 and a signal terminal T4. Furthermore, the Hall effect sensor arrangement 100 comprises a control device 150.

The contact terminals C1 and C2 of the four Hall effect components 101-1, 101-2 and 102-1, 102-2 are respectively provided in order to obtain a so-called ring contacting or ring interconnection of the four Hall effect components 101-1, 101-2 and 102-1, 102-2, i.e. the contact terminals C1 and C2 of the (at least) four Hall effect components 101-1, 101-2 and 102-1, 102-2 are interconnected with one another such that the four Hall effect sensor elements 101-1, 101-2 and 102-1, 102-2 are arranged together in a parallel-series interconnection. The ring contacting or ring interconnection is indicated in FIG. 1 by the encircled symbol "RK" at each of the four Hall effect components 101-1, 101-2 and 102-1, 102-2.

As will be shown by the following explanations with reference to the further figures, there are a multiplicity of possibilities for interconnecting the (at least) four Hall effect components with one another such that a parallel-series interconnection thereof is obtained. Therefore, the encircled symbol "RK" is illustrated at all the contact terminals C1 and C2 in FIG. 1, said symbol symbolically representing one of the possible interconnections for achieving the parallel-series interconnection of all four Hall effect sensor elements 101-1, 101-2 and 102-1, 102-2.

A parallel-series interconnection (or parallel-series connection) is understood to mean the following relationship in the context of the present invention.

In all of the exemplary embodiments described herein with reference to FIGS. 1 to 19, the Hall effect components are situated in a parallel-series connection, which means that two arbitrary signal terminals can be taken and can be connected to a current source (which is provided for example by the control device 150) such that a current I is fed to one of the two signal terminals and is drawn from the other signal terminal. A parallel-series connection thus means that the total current I is divided into two current portions I1, I2, wherein both portions I1, I2 differ from zero, and wherein at least one current portion I1 or I2 flows via a Hall effect component which differs from that into which the current I (Hall current or control current) is fed, and furthermore differs from that from which the current I is output. Consequently, a current portion thus flows via a Hall effect component which has no signal terminal active as a supply signal terminal. Consequently, the current division is designated by the term "parallel", wherein "more than one component" is designated by the term "in series" (series).

The control device 150 illustrated in FIG. 1 is couplable, then, to the four signal terminals T1-T4 of the four Hall effect sensor elements 101-1, 101-2 and 102-1, 102-2 in a plurality of operating phases (spinning current phases or spinning voltage phases of the Hall effect sensor arrangement 100) such that in the different operating phases at least one of the Hall effect sensor elements 101-1, 101-2 and 102-1, 102-2 responds to a first magnetic field component $B_1$ (e.g. $B_x$) in a first detection direction and at least another of the Hall effect sensor elements 101-1, 101-2 and 102-1, 102-2 responds to a second magnetic field component $B_2$ (e.g. $B_y$) in a second detection direction, wherein the first and the second detection directions (e.g. in the detection plane=plane of the drawing) are different.

As is illustrated by way of example in FIG. 1, the two Hall effect sensor elements 101-1, 101-2 are aligned in the first detection direction, e.g. in x-direction in FIG. 1, wherein the two Hall effect sensor elements 102-1, 102-2 are aligned or arranged in the second detection direction, e.g. the y-direction in FIG. 1. Consequently, the first and second detection directions are e.g. perpendicular to one another in the detection plane.

With regard to the concept of a Hall effect sensor arrangement according to the invention, however, it should be noted that Hall effect components over and above a number of four can be used according to the invention. In this regard, by way of example, 2×n Hall effect sensor elements where n=integer and n≥2 can be used according to the invention. In this case, a first group 1 to n of the Hall effect sensor elements are arranged (or aligned) in the first detection direction, wherein a second group n+1 to 2n of the Hall effect sensor elements are arranged in the second detection direction, wherein the first and second detection directions are different.

The Hall effect sensor arrangement 100 can furthermore also comprise 4×n (where n≥2 and is an integer) Hall effect components, wherein the first group 1 to n of the (4×n) Hall effect components are arranged in (along) the first magnetic field detection direction, the second group n+1 to 2n of the Hall effect components are arranged in the second magnetic field detection direction, a third group 2n+1 to 3n of the Hall effect sensor elements are arranged in a third magnetic field detection direction, and a fourth group 3n+1 to 4n of the Hall effect sensor elements are arranged in a fourth magnetic field detection direction (detection direction hereinafter). In this case, the first and third detection directions and the second and fourth detection directions are antiparallel to one another, for example, and the first and second detection directions and the third and fourth detection directions are perpendicular to one another in the reference or measurement plane.

The (at least) four Hall effect sensor elements 101-1, 101-2 and 102-1, 102-2 in accordance with FIG. 1 can furthermore comprise a first pair having a first and second Hall effect component 101-1, 101-2 and a second pair having a third and fourth Hall effect component 102-1, 102-2, wherein the first and second Hall effect sensor elements 101-1, 101-2 have a first and second detection direction arranged perpendicular to one another, and wherein the third and fourth Hall effect sensor elements 102-1, 102-2 have a third and fourth magnetic field detection direction embodied perpendicular to one another, wherein the first, second, third and fourth magnetic field detection directions differ from one another.

In accordance with exemplary embodiments of the present invention, the (at least) four Hall effect sensor elements 101-1, 101-2 and 102-1, 102-2 are so-called vertical Hall effect sensor elements.

As has already been indicated above, each Hall effect component 101-1, 101-2 and 102-1, 102-2 can have in each case three contacts with a first and second contact terminal C1, C2 and a third contact terminal or signal terminal T#, wherein in accordance with one exemplary ring contacting the first contact terminal C1 of each Hall effect sensor element is connected to a first contact terminal C1 of one further Hall effect sensor element, and wherein the second contact terminal C2 of each Hall effect sensor element is connected to a second contact terminal C2 of another further Hall effect sensor element, and wherein the third contact terminal (as measurement signal terminal or supply signal terminal) is couplable to the control device 150, e.g. via a multiplexer (not shown in FIG. 1).

According to the present invention, each Hall effect sensor element 101-1, 101-2 and 102-1, 102-2 can thus have exactly three contact terminals. In this case, the three contact terminals C1, C2, T# of each Hall effect sensor element can be aligned on a straight line, wherein the first and second contact terminals C1, C2 can each have an identical geometry, and these contact terminals C1, C2 are positioned or aligned in each case symmetrically with respect to the third contact terminal T#.

Furthermore, the (at least) four Hall effect sensor elements 101-1, 101-2 and 102-1, 102-2 in FIG. 1 can be arranged in a manner grouped in at least two groups 101-1, 101-2 and 102-1, 102-2, wherein a distance can be provided between the at least two groups, which are aligned at least in a first and second direction, wherein the distance can be at least 300 μm.

According to the invention, the first and second detection directions can be parallel, wherein the first and second detection directions can also be arranged perpendicular to one another.

The Hall effect sensor arrangement 100 can furthermore comprise at least four groups of Hall effect sensor elements (not shown in FIG. 1), wherein two groups are aligned along a first detection direction, and the further two groups are aligned along a second detection direction, wherein the first and second detection directions are perpendicular to one another. In this case, the at least four groups of Hall effect components can have the same number of Hall effect components.

The function of the control device 150 will now be discussed in detail below.

The control device 150 is designed, then, to drive and read the (at least) four Hall effect sensor elements 101-1, 101-2 and 102-1, 102-2 in the different operating phases, wherein in different operating phases in each case different pairs of signal terminals of the assigned Hall effect sensor elements are active for feeding in the operating signal (control signal) and for reading out the measurement signal.

The control device 150 is furthermore designed, then, to drive the different signal terminals according to the so-called spinning current principle or the spinning voltage principle as measurement signal terminal pairs or supply signal terminal pairs of the respectively assigned Hall effect components. The control device 150 can furthermore be designed, then, to evaluate the detected measurement signals with regard to the magnetic field components in the different operating phases by means of a linear combination in the first and/or second detection direction. Alternatively or additionally, an evaluation device (not shown in FIG. 1) can be provided, wherein the evaluation device can be designed to evaluate the measurement signals provided by the control device with regard to the instantaneously present magnetic field components in the first and second magnetic field detection direction. In this case, the evaluation device can be designed to carry out a linear combination of the measurement signals obtained in the different operating phases. As has already been indicated above, the evaluation device can also be part of the control device 150.

The physical construction of an individual Hall effect component and the electrical equivalent circuit diagram thereof will now be described below with reference to FIGS. 2A and 2B. The reference signs of the Hall effect sensor element 101-1 from FIG. 1 are adopted below, wherein the following explanations should make it clear that the Hall effect component illustrated in FIGS. 2A-B and its description are equally applicable to the further Hall effect components 101-1, 101-2 and 102-1, 102-2 illustrated in FIGS. 1 to 19.

Exemplary embodiments of the present invention relate for example to Hall effect components having Hall effect regions which have three contacts, i.e. two contact terminals C1, C2 and a signal terminal T#, wherein such a Hall effect component can be designated by the term "3C Hall effect component". If at least three such regions are then wired with one another in a kind of ring circuit (designated by 3Rg), such an arrangement having n-doped regions is designated as a 3CnRg Hall effect component. In connection with the present application, by way of example, vertical Hall effect components (V-Hall elements) are taken into consideration, wherein V-Hall elements respond to a magnetic field component parallel to the main surface of the chip or substrate, which hereinafter (as illustrated in FIGS. 1 to 19) is parallel to the x-y-plane (plane of the drawing).

Figure 2A:
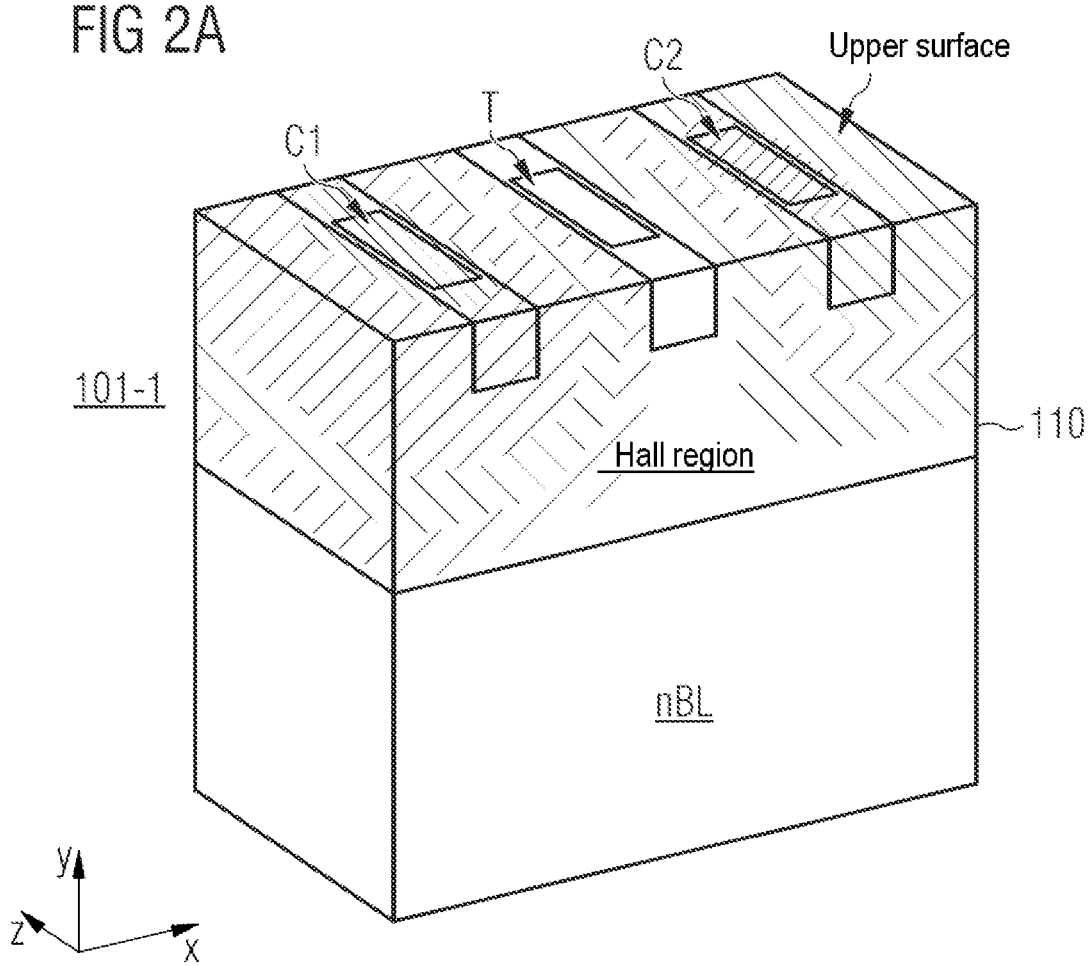

The Hall effect component illustrated in FIG. 2A is for example also designated as a 3C-V-Hall element of the first type.

In this case, the buried layer nBL is optional. The Hall region 110 is lightly or moderately n-doped. The contacts C1, C2, T# are shallow $n^+$S/D diffusions (e.g. 0.2 μm deep) and can optionally be surrounded by larger and deeper n-type well diffusions in order to reduce the contact resistance value and to reduce the electric field strength at the periphery. The component 101-1 is isolated from its surroundings (i.e. the substrate into which it is implanted/diffused or grown epitaxially) by dielectric layers (trench isolation) or by reverse-biased pn junctions. It can optionally be covered by a conductive upper plate which is isolated from the Hall region and can be connected to a reference potential by wire.

This component can be operated in a spinning current scheme or spinning voltage scheme in order to reduce the offset error (=zero error) of the component 101-1. If a component has a non-vanishing output signal in the case of a zero magnetic field, this is designated as an offset error. In spinning schemes, the component is operated in different operating modes and the output signals are combined. The combination of output signals has a very small offset error, which is also designated as residual offset.

Figure 2B:
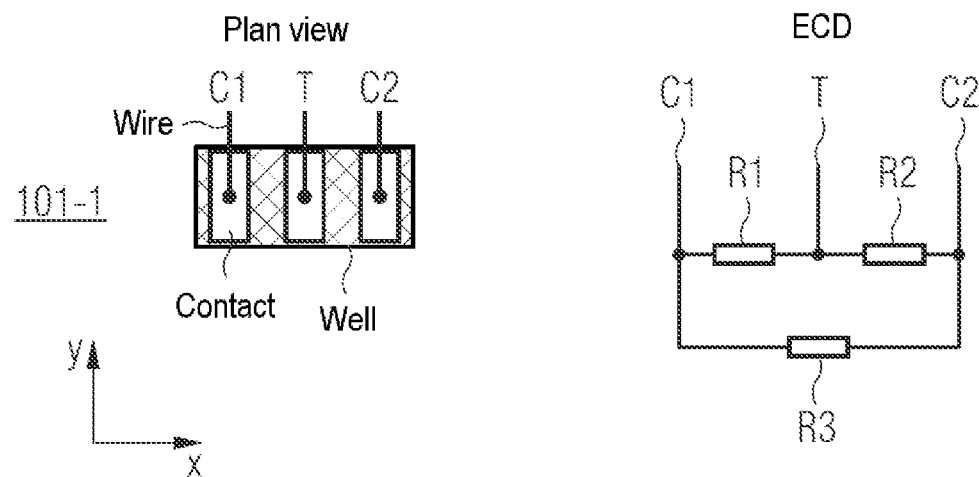

FIG. 2B then shows the electrical equivalent circuit diagram of such a Hall effect component 101-1, wherein it is evident that the resistance values R1, R2, R3 are different with respect to one another and for the different wells of the different Hall effect components, wherein, as will be explained below, the combination (or linear combination) of the output signals of the Hall effect components of the Hall effect sensor arrangement 100 according to the invention should vanish as far as possible over all the operating phases.

A schematic basic illustration as plan view of a Hall effect sensor arrangement 100a in accordance with one exemplary embodiment will now be described below with reference to FIG. 3.

As is evident in FIG. 3, the four (2×n, where n=2) Hall effect components 101-1, 101-2 and 102-1, 102-2 are connected to one another at the respective contact terminals C1, C2, which are provided for producing the ring contacting, such that the first contact terminal C1 of the Hall effect sensor element 101-1 is connected to the first contact terminal C1 of the Hall effect component 101-2, the second contact terminal C2 of the Hall effect component 101-1 is connected to the first contact terminal C1 of the Hall effect component 102-2, the second contact terminal C2 of the Hall effect component 101-2 is connected to the first contact terminal C1 of the Hall effect component 102-1 and the second contact terminal C2 of the Hall effect component 102-1 is connected to the second contact terminal C2 of the Hall effect component 102-2 in order to obtain the illustrated "ring contacting" of the Hall effect components 101-1, 101-2 and 102-1, 102-2.

The signal terminals T1-T4 are available to the control device 150 in order to use them as a pair of measurement signal and supply signal terminals depending on the operating phase set. As is illustrated in FIG. 3, the Hall effect sensor elements 101-1 and 101-2 are arranged parallel to one another along the y-direction and are thus sensitive for a magnetic field component in the x-direction, while the Hall effect sensor elements 103, 104 are arranged parallel to one another along the x-direction and are thus sensitive for a magnetic field component in the y-direction ($B_y$)* The four Hall effect sensor elements 101-1, 101-2 and 102-1, 102-2 are arranged for example in the substrate surface (as reference or measurement plane) which is parallel to the plane of the drawing (x-y-plane).

As is illustrated in FIG. 3, therefore, four wells are provided, each having three contacts (two contact terminals C1, C2 and a signal terminal T#), wherein the four wells (or Hall effect sensor elements) are connected via their respective outer contacts C1, C2 in a ring contacting, i.e. are not arranged parallel to one another. To put it more precisely, two Hall effect components 101-1, 101-2 are arranged such that their output signal, tapped off at the respective signal terminal T1, T2, is proportional to the x-component $B_x$ of the magnetic field present if a current flows between the two outer contact terminals, i.e. in each case from their C1 to C2, while the other two Hall effect components 102-1, 102-2 are arranged such that their respective output signal is proportional to the y-component $B_y$ of the magnetic field if a current flows between the two outer contact terminals, i.e. in each case between their C1 and C2, such that the output signal that can be tapped off at the signal terminals T3, T4 is proportional to the y-magnetic field component of the magnetic field present.

Therefore, the Hall effect sensor arrangement illustrated in FIG. 3 responds to a combination (addition) of the two magnetic field components $B_x$ and $B_y$ (i.e. $B_x + B_y$) of the magnetic field present, i.e. a total signal (based on a linear combination over the individual measurement phases) has a dependence on an addition of the x- and y-magnetic field components ($B_x + B_y$).

The different operating phases of so-called spinning current operation of the Hall effect sensor arrangement 100a from FIG. 3 will now be discussed below.

The Hall effect sensor arrangement 100a can thus be operated in a so-called spinning scheme (spinning current scheme or spinning voltage scheme) in order to reduce or remove the offset error (=zero error) of the Hall effect components 101-1, 101-2 and 102-1, 102-2. The term offset error denotes a non-vanishing output signal of a Hall effect component in the case of a zero magnetic field (no magnetic field present). In the spinning schemes, then, the signal terminals T1-T4 of the Hall effect components 101-1, 101-2 and 102-1, 102-2 used are in each case used in pairs as supply signal terminals and measurement signal terminals and interchanged cyclically (round in turn) from operating phase to operating phase. By means of a suitable evaluation, e.g. by means of a linear combination, of the different output signals, a very small resulting offset error, designated as residual offset, can be obtained.

Spinning Current Scheme:

In operating phase No. 1, current is injected to the terminal T1 and extracted at the terminal T3 (e.g. T3 can be grounded). The voltage between the terminals T2 and T4 is the output signal in this phase.

In operating phase No. 2, current is injected into the terminal T2 and extracted at the terminal T4 (e.g. T4 can be grounded). The voltage between the terminals T1 and T3 is the output signal in this phase.

In operating phase No. 3, current is injected into the terminal T3 and extracted at the terminal T1 (e.g. T1 can be grounded). The voltage between the terminals T2 and T4 is the output signal in this phase.

In operating phase No. 4, current is injected into the terminal T4 and extracted at the terminal T2 (e.g. T2 can be grounded). The voltage between the terminals T1 and T3 is the output signal in this phase.

Advantageously, the current injected into the component is identical in all the operating phases of the spinning current scheme.

Spinning Voltage Scheme:

In operating phase No. 1, voltage is applied to the terminal T1 and T3 is grounded. The terminals T2 and T4 are short-circuited and the short-circuit current is the output signal in this phase.

In operating phase No. 2, voltage is applied to the terminal T2 and T4 is grounded. The terminals T1 and T3 are short-circuited and the short-circuit current is the output signal in this phase.

In operating phase No. 3, voltage is applied to the terminal T3 and T1 is grounded. The terminals T2 and T4 are short-circuited and the short-circuit current is the output signal in this phase.

In operating phase No. 4, voltage is applied to the terminal T4 and T2 is grounded. The terminals T1 and T3 are short-circuited and the short-circuit current is the output signal in this phase.

Advantageously, the voltage applied to the component is identical in all the operating phases of the spinning voltage scheme.

Finally, the output signals of all the operating phases can be combined in all the spinning schemes. It is also possible to combine only two operating phases, as a result of which the two must be chosen such that the supply terminals in one phase are signal terminals in the other phase and vice versa (e.g. phases No. 1 and No. 2 suffice to cancel the offset, but phases No. 1 and No. 3 do not suffice).

The combination of signals of individual operating phases is a linear combination, wherein the absolute value of the coefficients of this linear combination is dependent on the supply current (for spinning current systems) or the supply voltage (for spinning voltage systems). If supply current (for spinning current systems) or supply voltage (for spinning voltage systems) is constant for all the operating phases, the coefficients have an identical absolute value. The sign of the coefficients is such that the residual offset vanishes in the combination signal. This can readily be verified if each well is replaced by its equivalent circuit in accordance with FIG. 2b. The resistance values R1, R2, R3 are different with respect to one another and for all four wells, wherein the combination of output signals should still vanish over all the operating phases.

The component in FIG. 3 exhibits an output signal in phase No. 1 which is proportional to Bx+By. In phase No. 2, the output signal is also proportional to Bx+By (and also in phases No. 3 and No. 4).

A further schematic basic illustration of a Hall effect sensor arrangement 100b in accordance with one exemplary embodiment will now be described below with reference to FIG. 4.

As is evident from FIG. 4, the Hall effect sensor arrangement 100b illustrated therein comprises, relative to the Hall effect sensor arrangement 100a illustrated in FIG. 3, in each case interchanged connections between the outer contact terminals C1 and C2 with respect to the first and second Hall effect components 101-1 and 101-2 and also among one another.

As is illustrated in FIG. 4, therefore, the following contact terminals of the individual Hall effect components 101-1, 101-2 and 102-1, 102-2 are connected to one another: C1(101-1) to C1(101-2); C2(101-1) to C2(102-2); C2(101-2) to C2(102-1); and C2(102-1) to C1(102-2). The reference signs refer to the contacts C1 or C2 of the respective Hall effect components.

The ring contacting of the Hall effect components at the respective contact terminals C1 and C2 of the Hall effect components 101-1, 101-2 and 102-1, 102-2 as illustrated in FIG. 4 results in a proportionality of the output signals at the signal terminals T1-T4 with respect to a difference between the magnetic field components $B_x$ and $B_y$ (i.e. $B_x-B_y$).

With both the Hall effect sensor arrangements 100a, 100b illustrated in FIGS. 3 and 4, it is thus possible to detect output signals which, in the case of the Hall effect sensor arrangement 100a, are based on an addition of the magnetic field components $B_x$, $B_y$ present (i.e. proportional to $B_x+B_y$), wherein, on the basis of the Hall effect sensor arrangement 100b, at the contact terminals T1-T4 thereof, it is possible to detect output signals which respond to a difference between the magnetic field components $B_x$, $B_y$ in the first and second detection directions (i.e. proportional to $B_x-B_y$).

In a downstream combination circuit, which for example can be implemented in the control device 150 or else can be arranged additionally (not shown in FIGS. 3 and 4), the desired signals for the two magnetic field components $B_x$ and $B_y$ can then be extracted from the output signals ($B_x+B_y$) of the Hall effect sensor arrangement 100a and the output signals ($B_x-B_y$) of the Hall effect sensor arrangement 100b.

It is possible to obtain further Hall effect sensor arrangements by proceeding from the Hall effect sensor arrangements 100a, 100b presented above and by carrying out a translation of one or more wells. However, a rotation is not allowed and the connections of the contacts must remain unchanged.

The following explanations will show that the Hall effect sensor arrangements 100a, 100b comprising in each case four Hall effect sensor elements as illustrated in FIGS. 3 and 4 can also be generalized for Hall effect sensor arrangements comprising a considerably greater number of Hall effect components (wells).

FIGS. 5A-B then show in each case a schematic basic illustration of further Hall effect sensor arrangements 100c and 100d in accordance with further exemplary embodiments.

As is illustrated in FIG. 5A, the Hall effect sensor arrangement therein comprises an even number (2×n) of horizontally aligned Hall effect components 101-1 to 101-2n along the x-direction, and likewise an even number (2×n) of vertically aligned Hall effect components 102-1 to 102-2n along the y-direction.

The Hall effect sensor arrangement illustrated in FIG. 5B then comprises an odd number (2×n+1) of horizontally aligned Hall effect components 101-1 to 101-2n+1 along the x-direction and furthermore an odd number (2×n+1) of vertically aligned Hall effect components 102-1 to 102-2n+1 along the y-direction. The respective Hall effect components are in each case connected to one another again at their contact terminals C1, C2 so as to obtain a ring contacting of all 4×n Hall effect components in FIG. 5A and all 4×n+2 Hall effect components in FIG. 5B.

In the general case in FIG. 5B, in a first operating phase, the positive supply is connected for example to T_1, and the negative supply to T_2n+2, such that half of the current flows from T_1 via one of the outer contacts to T_2n+2, and passes 2n components in the process (each time from one outer contact to the opposite outer contact), and the other half of the current flows from T_1 via the other outer contacts to T_2n+2, and likewise crosses 2n components (different than the first 2n components). 2n output signals can be tapped off: the first output signal between T_2 and T4n+2, the second between T_3 and T4n+1, . . . , and the 2n-th between T_2n+1 and T_2n+3. Each of these signals is proportional to Bx−By, i.e. the difference ($B_x-B_y$) between the magnetic field components $B_x$, $B_y$ of the magnetic field present along the magnetic field detection directions x, y.

In a second operating phase, T_2 is connected to the positive supply and T_2n+3 is connected to the negative supply, and the first output signal is tapped off between T_3 and T_1 (it is proportional to Bx), . . . and the last of the 2n output signals is tapped off between T_2n+2 and T_2n+4 (it is proportional to By). All of the other output signals are once again proportional to Bx−By and, consequently, the average value of the sum of all the output signals is once again proportional to Bx−By. Consequently, all the terminals are rotated by 1, such that T_1 becomes T_2, T_2 becomes T_3, . . . , T_4n+1 becomes T_4n, and T_4n becomes T_1.

In a third operating phase, T_3 performs the role of T_1 of the first phase . . . and so on (for the further operating phases). In total, there are 4n+2 operating phases: in the m-th operating phase, T_m performs the role of T_1 in the first phase. Since there are 2n output signals per phase, this results in a total number of 2n*(4n+2) different output signals which are (can be) combined in the complete spinning scheme.

A further Hall effect sensor arrangement 100e in accordance with a further exemplary embodiment will now be described with reference to a schematic basic illustration in FIG. 6. The Hall effect sensor arrangement 100e illustrated in FIG. 6 constitutes an alternative embodiment to the Hall effect sensor arrangement 100b illustrated in FIG. 4 with a so-called "staircase" arrangement of the four Hall effect components (wells) 101-1, 101-2 and 102-1, 102-2. The (at least) four Hall effect components are now once again interconnected in a ring circuit at the contact terminals, while the signal terminals T1-T4 are available as measurement signal or supply signal terminals for the control device 150 (not shown in FIG. 6).

A numerical simulation of this Hall effect sensor arrangement 100e embodied as a "staircase" arrangement in FIG. 6 will now be explained with reference to FIGS. 7A-C.

The four Hall effect components (wells) were modeled in each case with a slight asymmetry, in order to bring about an offset signal.

The chosen boundary conditions or parameters for the numerical simulation in FIG. 7 are presented purely by way of example below.

The Hall effect components (wells) are 5 µm wide. The contacts (contact terminals C1, C2 and signal terminals T1-T4) are as wide as the wells. The length of the contacts is 1 µm, wherein the distance between the contacts is likewise 1 µm.

The numerical simulation of this arrangement reads: 4_3CVHall_in_ringcircuit2f.mph The conductivity is 62.5 S and the Hall mobility is 0.13/T. This makes it clear that
(i) the subtraction of signals of phases No. 1 (=V(T2)−V(T4)) and No. 2 (=V(T1)−V(T3)) cancels the offset,
(ii) the magnetic signals of Bx and By of both phases are added simultaneously,
(iii) a magnetic sensitivity of 15 mV/T for Bx and −15 mV/T for By results,
(iv) the total signal is proportional to the difference between Bx and By (i.e. to Bx−By)

FIG. 8 shows a further Hall effect sensor arrangement 100f in accordance with a further exemplary embodiment on the basis of a schematic basic illustration (as a plan view).

As is illustrated on the basis of the Hall effect sensor arrangement 100f in FIG. 8, the "staircase" arrangement of the Hall effect sensor arrangement 100e in FIG. 6 can be generalized with regard to more than four Hall effect sensor elements in a series connection.

The number of Hall effect components (wells) 101-1 to 101-n aligned along a first direction and Hall effect components (wells) 102-1 to 102-n aligned along a direction is identical, and produces a total number of 2n Hall effect components. The Hall effect components (wells) 101-1 to 101-n aligned along a first direction and Hall effect components (wells) 102-1 to 102-n aligned along a direction are arranged alternately, in successive fashion.

In the m-th operating phase, the terminal T_m is the positive supply terminal (connected either to a voltage source or to a current source) and T_k is the negative supply terminal where m=1, 2, . . . , 2n−1, 2n and where k=mod (m+n−1, 2n)+1. In each operating phase, 2n−2 terminals T# (i.e. all terminals apart from the two supply terminals), can be used as signal terminals. The signals of all the signal terminals are combined to form a total output signal, wherein all signals from terminals which lie between a positive and negative supply terminal in a counterclockwise direction are added, and all signals from other terminals are subtracted.

Example for 2n=4: The arrangement is depicted as a staircase as in FIG. 6 (arrangement 100e).

In operating phase No. 1, it is possible to proceed from the positive supply terminal T1 in a counterclockwise direction via the terminal T4 to the negative supply terminals T3. Therefore, the voltage at T4 is added in the total signal: +T4. The other signal terminal is T2, which is therefore subtracted in the total signal: −T2.

In operating phase No. 2, it is possible to proceed from the positive supply terminal T2 in a counterclockwise direction via the terminal T1 to the negative supply terminals T4. Therefore, the voltage at T1 is added in the total signal: +T1. The other signal terminal is T3, which is therefore subtracted in the total signal: −T3.

Therefore, the total signal is equal to T1−T2−T3+T4.

It goes without saying that all the signals can also be inverted, which is irrelevant to the offset error (this merely inverts the polarity of the detected fields).

The Hall effect sensor arrangement 100f illustrated in FIG. 8 obtains at the signal terminals T1-T2n output signals having a dependence on the difference ($B_x$−$B_y$) between the magnetic field components $B_x$, $B_y$ of the magnetic field present along the magnetic field detection directions x, y.

A schematic basic illustration of a further Hall effect sensor arrangement 100g in accordance with a further exemplary embodiment is illustrated below with reference to FIG. 9.

The Hall effect sensor arrangement 100g illustrated in FIG. 9 once again comprises four Hall effect components 101-1, 101-2 and 102-1, 102-2 connected in a ring interconnection, at the signal terminals T1-T4 of which Hall effect components it is possible to tap off output signals which respond to a difference ($B_x$−$B_y$) between the magnetic field components $B_x$, $B_y$ of the magnetic field present along the magnetic field detection directions x, y (or are proportional thereto).

The Hall effect sensor arrangement 100g illustrated in FIG. 9 is based on the Hall effect sensor arrangement 100e illustrated in FIG. 6, wherein a rearrangement of the staircase layout (from FIG. 6) can be obtained in FIG. 9 with a transposition or shifting of the Hall effect components. If the magnetic field components $B_x$, $B_y$ of the magnetic field present in the region of the respective Hall effect sensor arrangement 100e or 100g can be assumed to be homogeneous, the Hall effect sensor arrangements 100e and 100g illustrated in FIGS. 6 and 9 yield identical output signals having a dependence on the difference between the magnetic field components $B_x$, $B_y$ (i.e. proportional to $B_x$−$B_y$).

A further Hall effect sensor arrangement 100h in a schematic basic illustration as a plan view will now be described below with reference to FIG. 10.

The Hall effect sensor arrangement 100h illustrated in FIG. 10 is modified, then, relative to the Hall effect sensor arrangement 100g illustrated in FIG. 9 to the effect that the outer contacts (contact terminals C1, C2) of all the Hall effect components (wells) 102-1, 102-2 which respond or react to the $B_y$ magnetic field component are exchanged or interchanged with regard to their contacting. In this respect, reference is made to the two Hall effect components (wells) in FIG. 7, for example, in the case of which the magnetic field component $B_y$ in the Hall regions is indicated (cf. the representations of the above-indicated numerical simulation in FIG. 7). On the basis of this configuration of the Hall effect sensor arrangement 100h in FIG. 10, the total output signal thereof has an additive dependence on the magnetic field components $B_x$, $B_y$ (i.e. on $B_x+B_y$), in contrast to the differential dependence $(B_x-B_y)$ of the Hall effect sensor arrangement 100g in FIG. 9.

A further Hall effect sensor arrangement 100i in a schematic basic illustration as a plan view in accordance with a further exemplary embodiment will now be explained below with reference to FIG. 11.

Sensor arrangements which detect homogenous magnetic fields in the x- and y-directions have been discussed above. With a small modification of the wiring, however, it is also possible to detect spatial gradients of magnetic fields. The following arrangement in FIG. 11 has a total output signal which is proportional to dBx/dx+dBy/dx.

As is illustrated in FIG. 11, the Hall effect components 101-1 and 102-1 (with mutually orthogonal magnetic sensitivity) are arranged adjacent to one another, while the two Hall effect components 101-2 and 102-2 (with mutually orthogonal Hall sensitivity) are arranged adjacent to one another. As illustrated in FIG. 11, both area centroids of the Hall effect components 101-1 and 102-1 lie on a first straight line g1 parallel to the y-axis, while the area centroids of the two Hall effect components 101-2, 102-2 lie on a second straight line g2 parallel to the y-axis. The two straight lines g1 and g2 are spaced apart by the distance sx parallel to the x-axis. Furthermore, the following interconnection of the contact terminals C1, C2 of the respective Hall effect components 101-1, 101-2 and 102-1, 102-2 is provided in FIG. 11. The contact terminal C1 of the Hall effect component 101-1 is connected to the contact terminal C1 of the Hall effect component 102-2. The contact terminal C2 of the Hall effect component 101-1 is connected to the contact terminal C2 of the Hall effect component 102-1. The contact terminal C1 of the Hall effect component 102-1 is connected to the contact terminal C1 of the Hall effect component 101-2. Furthermore, the contact terminal C2 of the Hall effect component 101-2 is connected to the contact terminal C2 of the Hall effect component 102-2.

If T1 and T3 are supply terminals, T2 is proportional to By at the position x=−sx/2, and T4 is proportional to (−1)*By at the position x=+sx/2. Consequently, the voltage between T2 and T4 is proportional to By(x=−sx/2)−By(x=+sx/2), which is approximately identical to sx*dBy(x=0)/dx. This is the gradient of the By component along the x-direction. If T2 and T4 are supply terminals, T1 is proportional to Bx at the position x=−sx/2, and T3 is proportional to Bx at the position x=+sx/2. Consequently, the voltage between T1 and T3 is proportional to Bx(x=−sx/2)−Bx(x=+sx/2), which is approximately identical to sx*dBx(x=0)/dx. This is the gradient of the Bx component along the x-direction.

It goes without saying that the distance sx need not be aligned with the x-axis. It can also be aligned with the y-axis. The output signals are then proportional to the gradients of x- and y-components along the y-direction. In actual fact, the distance can also be inclined by 10° or 30° or 45° . . . arbitrarily with respect to the x-axis.

A further Hall effect sensor arrangement 100j in a schematic basic illustration as a plan view in accordance with a further exemplary embodiment will now be explained below with reference to FIG. 12.

In the case of the Hall effect sensor arrangement 100j illustrated in FIG. 12, then, relative to the Hall effect sensor arrangement 100i illustrated in FIG. 11, the positions of all the Hall effect components (wells) are rotated by 90°, wherein the relative alignment of all the Hall effect components with respect to one another remains unchanged, however, as is shown in FIG. 12. Consequently, the distance between the straight lines g1' and g2' (which in each case run parallel to the x-direction through the area centroids of the Hall effect components 101-1, 102-1 and 101-2, 102-2 respectively) in the y-direction of the opposite pairs of Hall effect components 101-1, 102-1 and 101-2, 102-2 is designated as distance sy. Consequently, the signal terminals T2 and T4 of the Hall effect components 101, 102 then respond to the $B_x$ magnetic field component of the magnetic field present, wherein the signal terminals T1 and T3 of the Hall effect components 101, 102 respond to the $B_y$ magnetic field component of the magnetic field present. The total output signal of a spinning signal scheme is thus proportional to dBx/dy+dBx/dy (or has a corresponding dependence).

A further Hall effect sensor arrangement 100k, as a schematic basic illustration in a plan view in accordance with a further exemplary embodiment will now be described below with reference to FIG. 13.

As is illustrated in FIG. 13, then, the Hall effect components 101-1 and 101-2 are spaced apart parallel to the x-direction by the distance sx (with respect to their area centroids), while the Hall effect components 102-1 and 102-2 are spaced apart parallel to the y-direction by the distance sy (with regard to their area centroids). The interconnection of the contact terminals C1 and C2 of the different Hall effect components 101-1, 101-2 and 102-1, 102-2 is implemented again as in FIGS. 11 and 12, respectively.

If T1 and T3 are supply signal terminals, the signal between the measurement signal terminals T2 and T4 is proportional to dBy(0,0)/dy. If T2 and T4 are supply terminals, the signal between T1 and T3 is proportional to dBx(0,0)/dx.

If each of the four wells were rotated about its center by 90° in the clockwise direction (i.e. the center of each well remains unchanged), the output signal is proportional to dBy(0,0)/dx+dBx(0,0)/dy.

As is illustrated in the case of the Hall effect sensor arrangement 100k in FIG. 13 relative to the Hall effect sensor arrangement 100j in FIG. 12, a different alignment of the distance sx between the components 101-1 and 101-2 is introduced in the case of the arrangement in FIG. 13, such that the resulting output signal between the signal terminal pair T1 and T3 of the first and second Hall effect components is proportional to dBx/dx+dBx/dy, as is clarified with reference to FIG. 13.

A further Hall effect sensor arrangement 100l in a schematic basic illustration as a plan view in accordance with a further exemplary embodiment will now be described below with reference to FIG. 14.

In contrast to the previous exemplary embodiments of Hall effect sensor arrangements having a substantially orthogonal alignment of the Hall effect sensor elements, it is furthermore equally possible to rotate the (at least) four (2×n) Hall effect components (wells) 101-1, 101-2 . . . 101-n and 102-1, 102-2 . . . 102-n about their center e.g. in the clockwise direction by an angle different than 90°, such as e.g. by 5°, 10°, 22.5°, 30° or 45° or any other angle value.

In the previous exemplary embodiments it was assumed that the wells of the Hall effect components 101-1 (#1) and 101-2 (#3) are parallel and the wells of the Hall effect components 102-1 (#2) and 102-2 (#4) are also parallel. This is not necessary, however, as is shown in FIG. 12. The starting point was the sensor arrangement 100h from FIG. 10. In order to arrive at the Hall effect sensor arrangement illustrated in FIG. 14, the Hall effect components (wells) 101-1 and 102-1 were then rotated by 22.5° in the clockwise direction, while the other two Hall effect components (wells)

101-2 and 102-2 were rotated by 22.5° in the counterclockwise direction. If the terminals T1 and T3 are supply terminals, T2 responds to Bx*sin(22.5°)+By*cos(22.5°), while T4 responds to Bx*sin(-22.5°)+By*cos(*22.5°), such that the signal between T2 and T4 is proportional to Bx*sin(22.5°)+By*cos(22.5°)+Bx*sin(-22.5°)+By*cos(-22.5°), which is equal to 2*By*cos(22.5°). It can thus be seen that the signal is less than in the case of parallel wells since cos(22.5°=0.924) is somewhat less than 1. The loss of magnetic sensitivity is 7.6%.

In a different operating phase, T2 and T4 are supply terminals and T1 responds to Bx*cos(22.5°)-By*sin(22.5°), while T3 responds to -Bx*cos(22.5°)-By*sin(22.5°), such that T1-T3 responds to 2*Bx*cos(22.5°).

It can once again be seen here that the sensitivity decreases by 7.6% on account of the factor cos(22.5°).

The above-indicated rotation of the Hall effect components 101-1, 101-2 and 102-1, 102-2 by 22.5° in the clockwise direction and counterclockwise direction, respectively, should be regarded as purely by way of example with regard to the angle values. In particular, the principle illustrated with reference to FIG. 14 for a Hall effect sensor arrangement 100*l* is applicable to arbitrary rotations of the Hall effect components as long as the resulting sensitivity does not decrease significantly, i.e. for example not more than 10% or 20%.

Furthermore, the rotations of the Hall effect components can be implemented such that in each case the Hall effect components 101-1 and 102-1 are arranged perpendicular to one another with respect to their magnetic field detection directions, while the Hall effect components 101-2 and 102-2 are likewise arranged perpendicular to one another with respect to their magnetic field detection directions.

Before further exemplary embodiments of Hall effect sensor arrangements according to the invention are now discussed in detail hereinafter, first of all once again essential physical relationships of Hall effect components such as are used in the Hall effect sensor arrangements according to the invention, and the ring circuits resulting therefrom are discussed below.

To summarize, therefore, it can be established that a Hall effect component is sensitive toward a magnetic field component orthogonal to the current flow direction through the Hall effect component.

A Hall effect component is sensitive toward a magnetic field component orthogonal to the current flow direction. Since the current flows between the outer contacts C1, C2 of a well, while the central contact T# delivers the signal, the component is sensitive toward the magnetic field component perpendicular to a line between the center of the two current-carrying contacts. If the components #1 and #3 are not parallel, the difference signal tapped off between T1 and T3 is proportional to a magnetic field component which is aligned in the center between the sensitive direction of component #1 and component #3. As a result, the sensitivity decreases since it is multiplied by a factor cos(angle/2), wherein "angle" denotes the angle between the sensitive directions of both components.

In the general case of 2×n components connected in a ring circuit, in an m-th operating phase (m=1, 2, . . . , 2n-1, 2n) the terminals T_m and T_k where k=mod (m+n-1, 2n)+1 are supply terminals. If, by way of example, T_m is the positive supply terminal and T_k is the negative supply terminal, there are exactly n-1 wells (Hall effect components) connected between the well No. m and well No. k in the clockwise direction, and there are n-1 wells connected between well No. m and well No. k in the counterclockwise direction, wherein none of the first n-1 wells is identical to the second n-1 wells. The wells can be counted beginning with the first which is connected to well No. m in the clockwise direction (equal to CW_1–clockwise_1), and the first which is connected to well No. m in the counterclockwise direction (=CCW_1–counterclockwise_1). This then affords CW_n-1 and CCW n-1 wells which are directly connected to well No. k. The signals are tapped off between CW_j and CCW_j where j=1, 2, . . . , n-2, n-1.

It is possible, then, to distinguish between the different cases and exemplary embodiments (as already described above):

In one exemplary embodiment, all wells CW_j and CCW_j are parallel for all j=1, 2, . . . , n-2, n-1 and so are the two supply wells, well No. m and well No. k. Consequently, all the wells are parallel to one another.

In a further exemplary embodiment, all wells CW_j and CCW_j are aligned in a first direction for all odd j (=1, 3, . . . ) and all CW_j and CCW_j for even j (=2, 4, . . . ) are aligned in a second direction, which is different than the first direction, wherein the supply well No. m is aligned in the second direction, while supply well No. k is aligned in the first direction for odd k and in the second direction for even k. Consequently, every second well along the ring circuit is aligned in a first direction and all others in a second direction. Typically, the two directions are perpendicular to one another, but in general any two different directions are possible. Examples are shown in FIGS. 6 to 13.

In yet another exemplary embodiment, all wells CW_j for odd j are aligned in a first direction, all wells CCW_j for odd j are aligned in a second direction, all wells CC_j for even j are aligned in a third direction and all wells CCW_j for even j are aligned in a fourth direction for arbitrary m (the alignment of well No. m and No. k need not be defined since, if one changes, the two former supply terminals then become signal terminals, the alignment of which is defined in accordance with the previous rules). One example is given in FIG. 14.

In yet another exemplary embodiment, the alignments of all the wells could be completely arbitrary. Even if no two wells are parallel to one another, the signal of each operating phase is proportional to a unique linear combination of Bx and By, wherein said linear combination is different in other operating phases, and the total signal is an average value or a sum of all the signals of individual operating phases.

In yet another exemplary embodiment, n successive wells in the ring circuit are aligned in a first direction, and the other n successive wells in the ring circuit are aligned in a second direction, which is different than the first direction. This is shown for the case n=2 in FIGS. 1, 3, 4 and for n generally in FIGS. 5A-B.

Reference will now be made below to further Hall effect sensor arrangements in a schematic basic illustration as a plan view in accordance with further exemplary embodiments with reference to FIGS. 15A-D.

In comparison with the Hall effect sensor arrangements presented above, it is possible to modify the connections of the individual Hall effect components for the purpose of obtaining the ring interconnection in the following manner in order to obtain one of the Hall effect sensor arrangements 100*m-q* illustrated in FIGS. 15A-D.

Figure 15A:
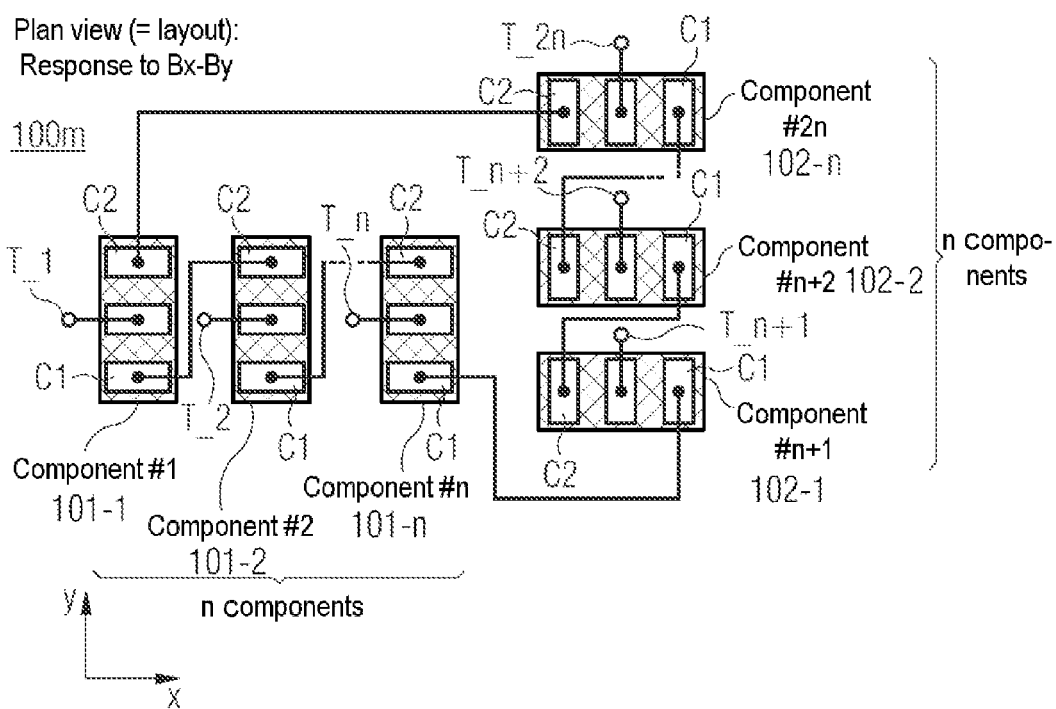

In the case of the Hall effect sensor arrangement 100*m* illustrated in FIG. 15A, the Hall effect components 101-1 to 101-*n* each having a control current direction in the y-direction, are arranged along the x-direction (with respect to the plane of the drawing), wherein in the Hall effect components 101-1 to 101-*n* in ascending order in each case the first contact terminal C1 of a Hall effect component is connected to the second contact terminal C2 of the subsequent Hall effect component in the numbering.

Correspondingly, in the Hall effect components 102-1 ... 102-n arranged in the y-direction and rotated by 90° with respect thereto (with a current flow direction in the x-direction) in each case also in ascending order the first contact terminal C1 of a Hall effect component is connected to the second contact terminal C2 of a directly subsequent Hall effect component in order to obtain the ring circuit formed by the 2×n Hall effect components (where n=integer and n≥2) as illustrated in FIG. 15A.

On the basis of the interconnection of the Hall effect sensor arrangement 100m as shown in FIG. 15A, a total signal having a dependence on an addition of the x- and y-magnetic field components ($B_x+B_y$) is obtained.

Figure 15B:
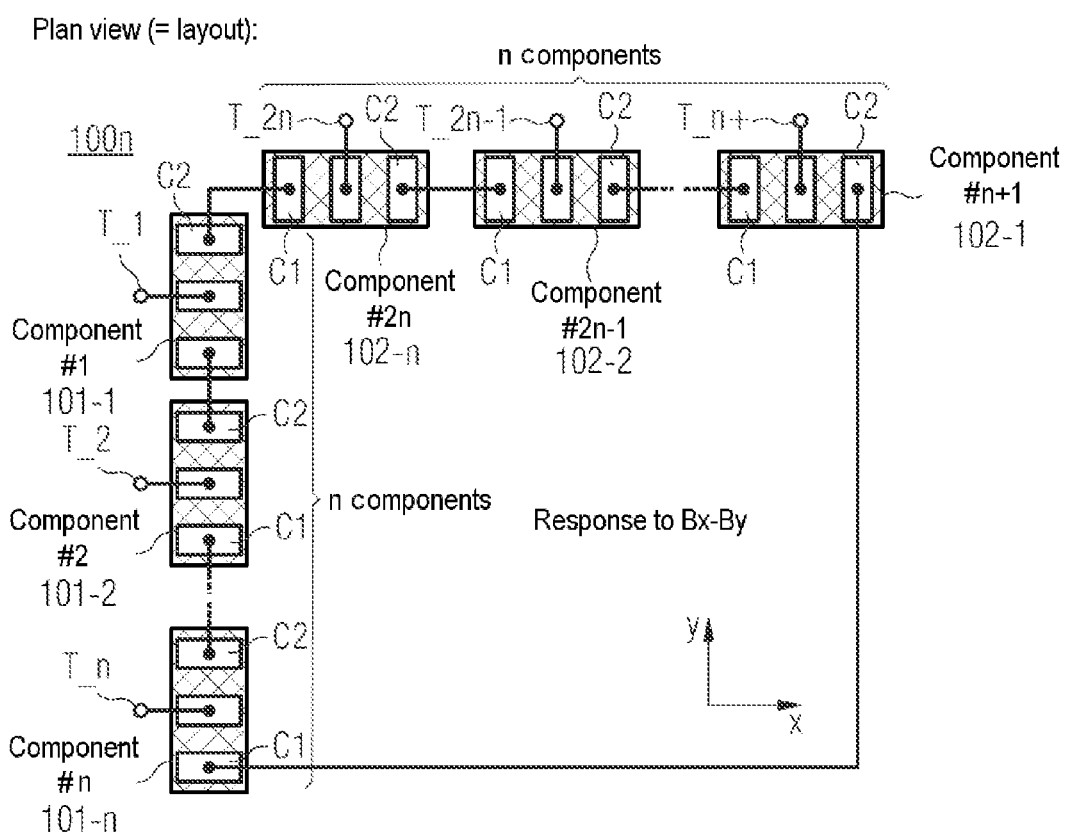

As is then indicated in FIG. 15B corresponding to a further Hall effect sensor arrangement 100n in accordance with a further exemplary embodiment, the 2×n Hall effect components can also be arranged in an "L" configuration. In this case, the Hall effect components 101-1 to 101-n (#1 to #n) are arranged for example along the y-direction, while the Hall effect components 102-1 to 102-n (#n+1 to #2n) are arranged along the x-direction. Furthermore, in FIG. 15B, the electrical feedback between the Hall effect component 102-1 (#n+1) and the Hall effect component 101-n (#n) is also embodied in an "L"-shaped fashion.

A further Hall effect sensor arrangement 100p in accordance with a further exemplary embodiment is described below with reference to FIG. 15C. The Hall effect sensor arrangement 100n from FIG. 15B can furthermore be modified, then, by the electrical return path being positioned via the Hall effect components (wells) in order to cancel the self-field, i.e. the magnetic field generated by the supply current within the Hall wells or Hall effect regions, as is illustrated for the Hall effect sensor arrangement 100p illustrated in FIG. 15C.

A further Hall effect sensor arrangement 100q in accordance with a further exemplary embodiment is described below with reference to FIG. 15D. In comparison with the Hall effect sensor arrangements 100m, 100n and 100p illustrated in FIGS. 15A-C it is furthermore possible to add further Hall effect components, as is illustrated in the further Hall effect sensor arrangement 100q in accordance with a further exemplary embodiment as illustrated in FIG. 15D. In the Hall effect sensor arrangement 100q, 4×n Hall effect sensor elements are arranged along four sides of a rectangle (square).

In this regard, the Hall effect sensor elements 101-1 to 101-n (#1 to #n) of the 4×n Hall effect sensor elements are arranged parallel to the y-direction in FIG. 15D, the Hall effect sensor elements 102-1 to 102-n (#n+1 to #2n) are arranged parallel to the x-direction, the Hall effect sensor elements 101-n+1 to 101-2n (#2n+1 to #3n) are arranged parallel to the y-direction, and the Hall effect sensor elements 102-n+1 to 102-2n (#3n+1 to #4n) are arranged parallel to the x-direction in FIG. 15D.

Referring to FIG. 15D, "parallel to the x- or y-direction" means that the respective Hall effect components are arranged along the respective direction, wherein the current flow direction through Hall effect components in FIGS. 15A-D also takes place parallel to the respective direction. The respective detection directions (magnetic field sensitivities) are in each case perpendicular (in the detection plane) to the respective current directions.

As is illustrated in FIG. 15D, the detection direction of the Hall effect sensor elements 101-1 to 101-n is antiparallel to that of the Hall effect sensor elements 101-n+1 to 101-2n, wherein the detection direction of the Hall effect sensor elements 102-1 to 102-n is furthermore antiparallel to that of the Hall effect sensor elements 102-n+1 to 102-2n. Furthermore, the detection direction of the Hall effect sensor elements 101-1 to 101-n is perpendicular to that of the Hall effect sensor elements 102-1 to 102-n, wherein the detection direction of the Hall effect sensor elements 101-n+1 to 101-n is furthermore perpendicular to that of the Hall effect sensor elements 102-n+1 to 102-2n.

In operating phase No. 1, the terminal T_1 is the positive supply terminal and T_2n+1 is the negative supply terminal. The first signal is tapped off between T_2 and T_4n. It is proportional to Bx–By. The second signal is tapped off between T_3 and T_4n–1. It is also proportional to Bx–By ... and so on, up to the (n–1)-th signal between T_n and T_3n+2, which is likewise proportional to Bx–By. The n-th signal is between T_n+1 and T_3n+1, which is not dependent on a magnetic field. The (n+1)-th signal is between T_n+2 and T_3n, which is also proportional to Bx–By ... and so on up to the 2n-th signal (=the last signal) between T_2n and T_2n+2, likewise proportional to Bx–By.

In operating phase No. 2, the terminal T_2 is the positive supply terminal and T_3n+2 is the negative supply terminal. The first signal is tapped off between T_3 and T_1. It is proportional to Bx. The second signal is tapped off between T_4 and T_4n. It is proportional to Bx–By ... and so on, up to the (n–2)-th signal between T_n and T_3n+4, which is proportional to Bx–By. The (n–1)-th signal between T_n+1 and T_3n+3 is not dependent on the magnetic field. Moreover, the n-th signal between T_n+2 and T_3n+2 is not dependent on the magnetic field. Moreover, the (n+1)-th signal between T_n+3 and T_3n+1 is not dependent on the magnetic field. The (n+2)-th signal between T_n+4 and T_3n is dependent on Bx–By ... and so on up to the signal between T_2n and T_2n+4, which is likewise proportional to Bx–By. The signal between T_2n+1 and T_2n+3 is dependent on Bx.

To summarize, it can be stated that the magnetic sensitivities with respect to Bx and By in the different operating phases are not the same, wherein some of the phases have no magnetic sensitivity. As a result, the efficiency of this type of magnetic field sensor is reduced somewhat, but nevertheless absolutely functional in principle.

Before further exemplary embodiments are discussed below, it is pointed out that, in addition to the vertical Hall effect components presented above, it is possible to use further geometries or architectures therefor.

In this regard, FIG. 16A shows a further possible embodiment of a vertical Hall effect component which can be used according to the invention. As is shown in FIG. 16A, the Hall effect component has a slender rectangular structure having two slender contacts C1, C2 facing one another in the center of the device.

Since the Hall region 110 is slender, it prevents the current from propagating toward the right of the right contacts or toward the left of the left contact, as a result of which substantially the entire current is concentrated below the signal terminal C1 (if C2 is used as supply terminal). The current flows within the buried layer 16 to the two large BL contacts C3, C4 at the ends of the device, wherein both BL contacts C3, C4 can be short-circuited, such that the device ultimately again has only three contacts.

The distance between the inner contacts C1, C2 and the BL contacts C3, C4 should be large enough to ensure that no current flows laterally from C1 and C2 to the BL contacts C3, C4 through the Hall region 110.

FIG. 16B shows a schematic three-dimensional view of a ring-shaped Hall effect component (with the electrical potential present therein in accordance with a numerical simulation). The ring-shaped Hall region 110 of the vertical Hall effect component in FIG. 16B lies alongside an opposite surface layer or buried layer 16 having the same ring shape. The contacts C1, C2, C3 are (diametrically) opposite branches of the ring, wherein a branch has two rectangular contact regions lying close together. By way of example, the two small contacts C1, C2 are isolated from the larger, third contact C3 by a hole 14 in the ring structure.

In this context it should be noted that essentially whenever these vertical Hall effect components have two symmetrical contacts, such as e.g. C1 and C2 in FIGS. 16A-B, the Hall effect sensor arrangements described above can be implemented "correspondingly". For this purpose, the two symmetrical contacts C1 and C2 perform the role of the two outer contacts (contact terminals) in the vertical Hall effect components described above.

These vertical Hall effect components are designated as "3C-V-Hall elements", for example. The following description of further exemplary embodiments of Hall effect sensor arrangements according to the invention will now have recourse for example to the implementations of vertical Hall effect components as illustrated in FIGS. 17A-B.

As is illustrated in FIGS. 17A-B, for the sake of symmetry, the third contact of the left component is divided into two parts. Instead of a large distance between the two central contacts and the third contact, the Hall region can also be cut off by a deep p-type diffusion or the like, which prevents a lateral current flow between the contacts C1, C2 and C3 in the Hall region and constrains the current to flow through the buried layer (nBL) or—if the nBL is not present—below this obstacle. The large distance or the deep p-type diffusion is designated as decoupling section and the contact C3 is designated as buried layer contact (BL contact). The right component has a ring topology, wherein the BL contact is arranged in an opposite branch of the ring relative to the other two contacts in an endeavor to prevent current flow between them in the Hall region and to constrain said current flow into the nBL (the shallow p-type wells in the other two branches of the ring along the y-direction have the same purpose). The two branches having the shallow p-type wells are the decoupling sections.

It should be noted that the position of the contact C3 is arbitrary; it can be on the left or on the right or in front of or behind the two contacts C1 and C2, since it only makes contact with the buried layer. Moreover, the region between C3 and the buried layer does not act as a Hall region, even if it is produced from the same material as the Hall region, since either the current distribution is vertical or current is absent, and, therefore, the electric Hall field in this region is either horizontal or absent and does not shift the potential of C3. In contrast thereto, the positions of the two contacts C1 and C2 relative to one another are actually relevant to the magnetic output signal, since their relative position determines the sign of the output signal for a given current distribution and for a given magnetic field. Therefore, both components are subsequently summarized by the following two-dimensional cross section in FIGS. 17A-B (in order to avoid a repetition of the above three-dimensional illustrations).

Even if C3 is sometimes designated as a buried layer contact, the buried layer can also be absent. In that case, the component is somewhat less efficient, such that the output voltage for a given supply voltage is lower, but nevertheless functions as long as the decoupling section does not completely cut off the Hall effect region from the contact C3. If a buried layer is present, it is even preferable if the decoupling section cuts off the Hall effect region from C3, since both are still connected via the buried layer.

On the basis of the second type of vertical Hall effect components as illustrated with reference to FIGS. 16A-B and 17A-B, for example the Hall effect sensor arrangement 100g illustrated in FIG. 9 can be mapped onto the further Hall effect sensor arrangement 100r in FIG. 18A.

As is now illustrated in FIG. 18A, the respective contact terminals of the (at least) four Hall effect components 101-104 are now interconnected with one another in a ring contacting, wherein the signal terminals T1-T4 are in each case provided as measurement signal terminal pairs and supply signal terminal pairs (in each case in a switchable manner for respective spinning signal schemes). Consequently, the explanations with regard to interconnection and functioning of the Hall effect sensor arrangement 100g in FIG. 9 are correspondingly applicable to the Hall effect sensor arrangement 100r in FIG. 18A.

FIG. 18B then shows the current profile—determined on the basis of a simulation—in each case through the individual Hall effect components 101-1, 101-2 and 102-1, 102-2 of the Hall effect sensor arrangement 100r in accordance with the applied magnetic field components $B_x$ and $B_y$, in two different operating phases Nos. 1 and 2.

As can be gathered from FIGS. 18A-C, during the first operating phase the signal terminals T1 and T3 form the supply signal terminals, while the signal terminals T2 and T4 form the measurement signal terminals. During operating phase No. 2 the signal terminals T2 and T4 form the supply signal terminals, while the signal terminals T1 and T3 form the measurement signal terminals.

As can be gathered from FIGS. 18B-C, all four wells (Hall effect components 101-1, 101-2 and 102-1, 102-2 of the Hall effect sensor arrangement 100r) are slightly asymmetrical for simulation purposes, in order to simulate offset errors. It should be noted that the region below each terminal T1 . . . T4 is laterally isolated (by a small interspace) from the Hall region below the two small contacts C1, C2 per component.

The following, purely exemplary boundary conditions or parameters were assumed for the simulation. The buried layer having a conductivity 100 times greater than that of the Hall region is situated at the underside. The width of all the components is approximately 5 μm. The terminal contacts have a length of 3 μm, and the other two contacts have a length of 1 μm and are spaced apart by 1 μm. A Hall mobility of 0.13/T was assumed.

In operating phase No. 1 a current of 150 μA is injected into the terminal T1 and T3 is grounded. The signal is tapped off as voltage V(T2)−V(T4). It is proportional to Bx−By. In operating phase No. 2 the same current is injected into the terminal T2 and T4 is grounded. The signal is tapped off as voltage V(T1)−V(T3), which is likewise proportional to Bx−By. If both signals are subtracted by means of V(T2)−V(T4)−V(T1)+V(T3), the offset errors are cancelled and the total output signal is 53 mV/T.

It is pointed out here that the term contacts is taken to mean highly doped regions on the surface of the Hall region of the same doping type (normally n-doped) and an ohmic connection by means of a contact hole or via (normally filled with a tungsten plug) to a metal connection layer such as metal 1 layer or metal 2 layer or higher metal layers (normally principally produced from aluminum or copper).

FIG. 19 then shows, in a schematic plan view, the Hall effect sensor arrangement 100r according to the invention in a further operating phase, in which the signal terminals T1 and T2 are used as supply signal terminals, wherein the total current I is impressed into the supply terminal T1, and wherein the two signal terminals T3 and T4 can be used as measurement signal terminals. In the operating state illustrated in FIG. 19 or in the operating phase illustrated, the operating current I (or control current) is impressed into the signal terminal T1 of the first Hall effect component 101-1 and output by the signal terminal T2 of the second Hall effect component 102-1. In the case of the interconnection of the Hall effect sensor arrangement 100r as illustrated in FIG. 19, the total current I is divided into two portions, i.e. into a first partial current I1 and a second partial current I2. In this case, the first partial current I1 flows via the Hall effect components 102-2, 101-2 that contain no supply terminal in the present operating phase. Furthermore, the second partial current I2 flows via no Hall effect component that differs from the two Hall effect components 101-1, 102-1 into which the total current I is impressed and output. In other words, the second partial current I2 flows exclusively via Hall effect components 101-1, 102-1 that provide a supply signal terminal that is active for the present operating phase.

Taking account of the Hall effect sensor arrangement 100r illustrated in FIG. 19, the term "parallel-series connection" or "ring interconnection" of the Hall effect components 101-1, 101-2, 102-1, 102-2 forming the Hall effect sensor arrangement will be discussed again below.

In all the exemplary embodiments, Hall effect components are in parallel-series connection, which means that two arbitrary terminals can be taken and can be connected to a current source, such that current is injected into one of the two terminals and is extracted from the other terminal. A parallel-series connection means that the total current is divided into two portions, both different than zero, wherein at least one portion flows via a Hall effect component that differs from that Hall effect component where the current is injected, and differs from that Hall effect component where the current is extracted—i.e. it flows via a Hall effect component that contains no supply terminal. Consequently, the current division is designated by the term "parallel" and "more than one component" is designated by the term "series".

Essential aspects and central concepts of the invention are summarized again below. In accordance with exemplary embodiments, at least three Hall effect components are interconnected into a parallel-series connection, wherein at least one Hall effect component responds to a magnetic field in a first direction and at least one other Hall effect component responds to a magnetic field in a second direction, which differs from the first direction. In this case, the number of the at least three Hall effect components is e.g. an even number. Furthermore, the at least three Hall effect components are e.g. vertical Hall effect components. Furthermore, the at least three Hall effect components are 2*n Hall effect components, and wherein Hall effect components respond to a magnetic field in a first direction and the other n Hall effect components respond to a magnetic field in a second direction, which differs from the first direction.

By way of example, each Hall effect component has a first contact, which is connected to a first contact of another Hall effect component, and a second contact, which is connected to a second contact of yet another Hall effect component, and a third contact, which is connected to a terminal. By way of example, each Hall effect component has exactly three contacts.

By way of example, the at least three Hall effect components are aligned on a straight line. By way of example, in the case of the at least three Hall effect components, two contacts have an identical geometry and are positioned and aligned symmetrically with respect to the third contact.

By way of example, the least three Hall effect components are grouped in at least two groups with distances between the at least two groups aligned in directions, wherein the distance is e.g. least 300 µm, and wherein all directions are e.g. parallel or wherein two directions are perpendicular to one another. By way of example, the at least two groups are four groups, wherein two groups are aligned along a first direction and the other two groups are aligned along a second direction, which is perpendicular to the first direction. By way of example, the at least two groups have the same number of Hall effect components.

One advantage of the procedure of connecting a plurality of wells in series with short circuits (i.e. by wires between contacts in the wells) is afforded for technologies with buried layers. If all the wells were combined to form a single well, they would also have a single buried layer that short circuits the contacts and reduces the output signal of the component. If large wells are subdivided into small wells and these are connected by means of wires, a buried layer is also subdivided and this prevents the short-circuit effect of the buried layer and consequently improves the magnetic sensitivity.

Further exemplary embodiments according to the invention will now be set out below on the basis of the Hall effect components shown in FIGS. 20-23 and the Hall effect sensor arrangements formed therefrom, wherein physical relationships of so-called vertical Hall effect components will firstly be presented again in order to elucidate the concept according to the invention.

Hall effect components consist of one or a plurality of Hall effect regions with supply terminals and signal terminals. The Hall effect takes place in the Hall effect regions, where the Lorentz force of the magnetic field on the mobile charge carriers leads to an electric Hall field. The mobile charge carriers are fed by an electrical power source connected to the supply terminals. The output signal of the Hall effect component can be tapped off at the signal terminals. All terminals are ohmic contacts, which turns the Hall effect component into a purely resistive component. V-Halls are vertical Hall effect components, which respond to a magnetic field component parallel to the main surface of the chip. Vertical Hall effect components are often asymmetrical, such that permutations of contacts have different electrical properties, such as e.g. internal resistance value.

Firstly, FIG. 20 illustrates a vertical Hall effect component 200 in a generalized manner, wherein a control device 250 is provided in order, during the different operating phases, to feed the different control signals to the component 200 and furthermore to tap off the resulting measurement signals at the component 200.

The starting point is a completely asymmetrical component 201 having four terminals T1, U1, V1, W1. A symmetrization can be achieved by using an additional three components, identified by 202, 203, 204—all identical to component 201—having respective terminals T2, T3, T4, U2, U3, U4, V2, V3, V4, W2, W3, W4, and by connecting or short-circuiting the terminals T1, U2, V3, W4 to form a new terminal T, the terminals T2, U3, V4, W1 to form a new terminal U, the terminals T3, U4, V1, W2 to form a new terminal V, and the terminals T4, U1, V2, W3 to form a new terminal W.

In that case, the complete arrangement comprising the Hall effect components 201, 202, 203, 204 is symmetrical if the terminals T, U, V, W are considered. Therefore, the symbol or equivalent circuit diagram can be used, such as for a customary Hall plate having a 90° symmetry. FIG. 21 illustrates a symbol with a Hall effect component 200 for the arrangement in FIG. 20.

The (resulting) Hall effect component 200 in FIG. 21 shows the type of symmetry better, it being pointed out that the resistance value between the terminals T and U differs from the resistance value between the terminals T and V. Therefore, in the present case, the term "symmetry" means that rotations by 90° lead to identical electrical parameters. Therefore, it is of importance in what order the terminals are drawn. If the terminals T, U, V, W succeed one another along a line in the strip-shaped individual vertical Hall effect components, the latter must also succeed one another along the periphery of the Hall plate symbol (i.e. of the Hall effect component 200) in FIG. 21, wherein it is irrelevant whether the sequence proceeds in the clockwise direction or counterclockwise direction. A change between clockwise direction and counterclockwise direction does not change the electrical parameters, but rather only changes the magnetic parameters (the sign of the detected field component). It should be noted that hereinafter the focus is directed essentially at the electrical properties and to a lesser extent at the magnetic properties.

To summarize, it should be noted that the symmetry which should be achieved is such that any rotation of the terminals TUVW leads to identical electrical properties. There are exactly three such rotations TUVW=>UVWT=>VWTU=>WTUV, which results in four settings (reference is therefore made to 90° symmetry, since 360°/4=90°; this originates from the simple case of a conventional Hall plate).

One consequence of this type of symmetry is that the potential of the signal terminals is near the average value of potentials of supply terminals.

In FIG. 22A, the terminals T and V are supply terminals and, in the case of a zero magnetic field, the potential at the terminals U and W—which are signal terminals—is in the middle of the potentials of T and V.

In practice, Hall effect components exhibit a certain electrical nonlinearity on account of velocity saturation or transition field effects. Therefore, the above rule for the potentials applies only in an approximate sense. Normally, the common-mode potential at U and V is at approximately 48% . . . 49% of the potential at T, if the potential at T is approximately 1 V. If the potential at T decreases to 100 mV or 10 mV, the common-mode potential at U and V converges to 49.9% of the potential at T, and at the limit of the vanishing potential at T it is exactly 50% of the potential at T. Therefore, to put it more precisely, the potential rule e applies only to electrically linear components and, consequently, it applies to real components only at the limit of the vanishing voltage drop across their supply terminals.

A spinning current scheme has (at least) two operating phases, wherein the first operating phase is shown in FIG. 22A and the second operating phase is shown in FIG. 22B. the current source 220 provides the control signal I. The current source 220 can be part of the control device 250 or can be driven by the latter.

That means that in the second operating phase the supply and signal terminals of the Hall effect components are interchanged relative to the first operating phase. The signal in the first operating phase is the voltage from the terminal W to U while the signal in the second operating phase is the voltage from the terminal T to V. If the signals of both phases are added, the offsets (signal offsets) cancel one another out, wherein the signals are added on the basis of a magnetic field.

In the case of more differentiated spinning current schemes, the supply terminals of phases 1 and 2 are interchanged and the signal outputs are also interchanged. All four signals of all four operating phases are then added. This results in even better offset cancellation, since this also cancels thermoelectric offset effects.

FIG. 23 shows a schematic basic illustration of a further Hall effect sensor arrangement 200 in accordance with a further exemplary embodiment, wherein according to the invention a low (auxiliary) current I_U and I_W is impressed into both signal terminals U, W.

If the Hall effect component 200 is symmetrical, it has an identical output resistance value at both supply terminals T and V, and, if identical currents are impressed or injected into both output terminals U and W, this does not change the differential output voltage.

By way of example, in operating phase 1, a small current I_W=I_U of e.g. 1 µA is impressed into the terminals U and W. It should be noted that the supply current I_T into the terminal T is very much greater, e.g. 150 µA.

Consequently, the additional currents into U and W increase only the common-mode potential of the output terminals, but not the differential voltage between W and U (which is the relevant output signal of the Hall effect component).

It should be noted that this can be carried out e.g. only in the operating phase #1 of a spinning current scheme, and not in other phases of the spinning current scheme. What is then achieved at least is that the combination of control current distributions of operating phase 1 (e.g. in the components 201, 202, 203, 204) differs from the combination of control current distributions of all the other phases.

Although the current through the positive supply terminal T does not change on account of the two additional currents, it should be noted that the current at the negative supply terminal V does actually change. Consequently, it can actually be stated that the additional currents I_U, I_W are control currents.

It should be noted that the polarity of the two additional currents I_U, I_W can also be changed arbitrarily. Instead of impressing them into the signal terminals U and W, they can also be extracted from the signal terminals U and W. In that case, the two additional currents I_U, I_W add up to the current at the positive supply terminal T, while the current at the negative supply terminal V is not changed.

Furthermore, by way of example, it is even possible to use a temporally variable current at the signal terminals U, W. By way of example, a current can be impressed into W and U in the first half of operating phase 1, while the same current is extracted in the second half of the operating phase. In this case, the working cycle is not necessarily 50%; it can also be 30% or as desired. This means, for example, that a current is injected into U and W in the first 30% of operating phase 1, while a current is extracted from U and W in the next 70% of the duration of operating phase 1.

The common-mode change on account of the two additional currents into the supply terminals actually has a small effect on the residual offset of the spinning current scheme since the internal resistance values thereof vary in response to the common-mode potential on account of the electrical nonlinearity of the Hall effect component.

A further effective exemplary embodiment uses the same currents in two supply-polarity-inverted spinning current phases.

In a further exemplary embodiment, for the component 200 in FIG. 23 it is assumed this time that the component 200 is not perfectly symmetrical. These two currents, instead of identical currents I_W=I_U then cause a small output voltage between the terminals U and W. The same holds true if the component were perfectly symmetrical, but the two currents have a small mismatch which often cannot be avoided in practice.

In order to make it even clearer, it is also conceivable to remove I_U, that is to say that I_U vanishes. I_W then generates a large offset error in the output signal of the component in operating phase #1. However, if the spinning current scheme has an operating phase #3, in which the supply terminals T and V are interchanged (this is referred to as supply polarity inversion), while the current I_W is still impressed into the output terminal W, the offset errors on account of I_W cancel one another out in the entire spinning current scheme.

It is pointed out, however, that in practice the best procedure is to use identical currents I_W, I_U where I_W=I_U in both phases #1 and #3.

The currents I_W, I_U should not be used in the other two operating phases #2 and #4, since the currents I_W, I_U would increase the control current at the supply terminals in operating phases #2 and #4 since U and W are supply terminals in these two phases #2 and #4, and then the spinning current scheme does not cancel the offset since consideration has to be given to providing a constant current into at least one of the two supply terminals as exactly as possible during all the spinning current phases.

It goes without saying that in phases #2 and #4 no current (or at least not the same current) flows via the signal terminals T and V.

It should be noted that no switches via which the currents flow into or from the signal terminals are required. Instead, the terminals U and W can be connected to two current sources 222, 224, which are switched on only during phases #1 and #3. This reduces errors on account of parasitic elements of the switches. The two current sources 222, 224 can be part of the control device 250 or can be driven by the latter.

Furthermore, the currents via the signal terminals need not necessarily flow during a specific phase of each spinning current cycle. Alternatively, it is also possible to cause said currents to flow only in every m-th (e.g. 100th) spinning current cycle.

Furthermore, the components 201-204 need not be aligned parallel; said components can be non-parallel or orthogonal; by way of example, one component can respond to Bx while another can respond to By.

The Hall effect sensor arrangement 200 therefore comprises a first Hall effect component, which is formed by a first electrically conductive region extending into the substrate perpendicularly to the surface of the substrate and has a plurality of terminal regions along a side face at the surface of the substrate, at least one second, identically constructed Hall effect component interconnected with the first Hall effect component, such that during operation of the Hall effect sensor arrangement with a spinning current technique on the assumption of an identical control current in the different spinning current operating phases, in each spinning current operating phase the same combination of control current distributions is obtained in the Hall effect sensor arrangement, wherein the first Hall effect component and the second Hall effect component each have 2×b (where b>2) contact terminals; and a control device which is couplable to the contact terminals of the first and second Hall effect components such that during the different spinning current operating phases of successive spinning current operating cycles the four contact terminals are each active alternately in pairs as control terminals and measurement terminals, wherein the control device is furthermore designed, during at least one (predefined) spinning current operating phase in each respective m-th (where m=1 to 1000) successive operating cycle, to drive the respective pairs of control and measurement terminals such that during these predefined spinning current operating phases the respective current flow through the control terminals is different, and the resultant additional current flows through the measurement terminals are nominally identical and thus compensate for the current flow difference in the control terminals.

During the at least one predefined spinning current operating phase nominally identical currents can flow via an integral number of measurement terminals. A first current can flow via a first measurement terminal in a first spinning current operating phase and a second current can flow via a first measurement terminal in a second spinning current operating phase, wherein the second spinning current operating phase has an inverted supply signal polarity relative to the first spinning current operating phase. The control device is designed for example to obtain an inversion of the supply signal polarity by a changeover between the potentials at the positive and negative supply terminals.

The two Hall effect components can respond for example to magnetic field components which are parallel with respect to the substrate surface (in-plane components). Alternatively, the at least two Hall effect components can respond to magnetic field components which are perpendicular with respect to the substrate surface (out-of-plane components).

To summarize, the vertical Hall sensor can be formed with a first and second Hall effect component, wherein a first electrically conductive region extends into a substrate perpendicularly to the surface of the substrate in order to form the first Hall effect component, which has a plurality of connection regions along a side face on the surface of the substrate, wherein the at least second identical Hall effect component is arranged in the substrate and is wired with the first Hall sensor element in such a way that if the Hall sensor is operated in the spinning current mode (while a current flow into or from the signal terminals is prevented), the same combination of control current distributions in the Hall sensor is obtained in each spinning current phase, wherein devices are provided for causing a current to flow via at least one signal terminal during at least some events of at least one spinning current phase.

The expression "some events of at least one phase" indicates that the current need not flow during every first spinning current phase, no current flows via the signal terminals in for example 100 complete spinning current cycles, and then during the 101st spinning current cycle current is injected into the signal terminals only during phase #1 or only during phases #1 and #3. In this case, during at least one spinning current phase, nominally identical current flows can flow via an even number of signal terminals.

In this regard, by way of example, a first current in a first spinning current phase can flow via a first signal terminal and a first current in a second spinning current phase can flow via a second signal terminal, as a result of which the second spinning current phase is supply-polarity-inverted relative to the first spinning current phase. The term "supply-polarity-inverted" is understood to mean that positive and negative supply terminals are interchanged. The two Hall sensor elements can respond to parallel magnetic field components or to perpendicular magnetic field components.

The invention claimed is:
1. A Hall effect sensor arrangement, comprising the following features:
   at least four, (2×n,) Hall effect components, (where n=integer and n≥2), wherein the Hall effect components each have two contact terminals and a signal terminal wherein the contact terminals of the at least four Hall effect components are interconnected with one another such that the at least four Hall effect components are arranged together in a parallel-series interconnection, and
   a control device which is couplable to the signal terminals of the at least four Hall effect components in a plurality of operating phases such that in the different operating phases at least one of the Hall effect components responds to a first magnetic field component in a first detection direction, and at least another of the Hall effect components responds to a second magnetic field component in a second detection direction, wherein the second detection direction is different than the first detection direction.

2. The Hall effect sensor arrangement as claimed in claim 1, wherein a first group 1 to n of the Hall effect components of the at least 2×n Hall effect components are arranged in the first detection direction, and wherein a second group n+1 to 2n Hall effect components of the 2×n Hall effect components are arranged in the second detection direction, wherein the first and second detection directions are different.

3. The Hall effect sensor arrangement as claimed in claim 2, wherein the first and second detection directions are perpendicular to one another in a detection plane.

4. The Hall effect sensor arrangement as claimed in claim 1, wherein the Hall effect sensor arrangement comprises 4×n Hall effect components, (where n=integer and n≥2), wherein a first group 1 to n Hall effect components of the 4×n Hall effect components are arranged in the first detection direction, the second group n+1 to 2n of Hall effect components are arranged in the second detection direction, a third group 2n+1 to 3n of the Hall effect components are arranged in a third detection direction, and a fourth group 3n+1 to 4n of the Hall effect components are arranged in a fourth detection direction.

5. The Hall effect sensor arrangement as claimed in claim 4, wherein the first and third detection directions are antiparallel to one another and the second and fourth detection directions are antiparallel to one another, and wherein the first and second detection directions are perpendicular to one another and the third and fourth detection directions are perpendicular to one another in the detection plane.

6. The Hall effect sensor arrangement as claimed in claim 1, wherein the at least four Hall effect components comprise a first pair having a first and second Hall effect component and a second pair having a third and fourth Hall effect component, wherein the first and second Hall effect components have a first and second detection direction arranged perpendicular to one another, and wherein the third and fourth Hall effect components have a third and fourth magnetic field detection direction embodied perpendicular to one another, wherein the first, second, third and fourth magnetic field detection directions differ from one another.

7. The Hall effect sensor arrangement as claimed in claim 1, wherein the at least four, 2×Hall effect components are vertical Hall effect components.

8. The Hall effect sensor arrangement as claimed in claim 1, wherein each Hall effect component has three contacts with the first and second contact terminals and a third contact terminal embodied as a signal terminal, wherein the first contact terminal of the Hall effect component is connected to the first contact terminal of a further Hall effect component, and wherein the second contact terminal of the Hall effect component is connected to a second contact terminal of yet another Hall effect sensor element, and wherein the third contact terminal is couplable to the control device.

9. The Hall effect sensor arrangement as claimed in claim 8, wherein each Hall effect component has exactly three contact terminals.

10. The Hall effect sensor arrangement as claimed in claim 9, wherein the three contact terminals of each Hall effect component are aligned on a straight line, and wherein the first and second contact terminals each have an identical geometry and the first and second contact terminals are positioned and aligned symmetrically with respect to the third contact terminal.

11. The Hall effect sensor arrangement as claimed in claim 1, wherein the at least four Hall effect components are arranged in a manner grouped in at least two groups, wherein a distance is provided between the at least two groups, which are aligned at least in a first and second direction.

12. The Hall effect sensor arrangement as claimed in claim 11, wherein the distance is at least 300μm.

13. The Hall effect sensor arrangement as claimed in claim 11, wherein the at least first and second directions are parallel.

14. The Hall effect sensor arrangement as claimed in claim 11, wherein the first and second directions are perpendicular to one another.

15. The Hall effect sensor arrangement as claimed in claim 11, wherein the Hall effect sensor arrangement comprises at least four groups of Hall effect components, wherein two groups are arranged along a first direction and the further two groups are arranged along a second detection direction, wherein the first and second detection directions are perpendicular to one another.

16. The Hall effect sensor arrangement as claimed in claim 11, wherein the at least four groups each have the same number of Hall effect components.

17. The Hall effect sensor arrangement as claimed in claim 11, wherein the control device is designed to drive and operate the at least four Hall effect components in the different operating phases, wherein in different operating phases different pairs of signal terminals of the at least four Hall effect components are active on the one hand for feeding in the operating signal and on the other hand for reading out the measurement signal.

18. The Hall effect sensor arrangement as claimed in claim 17, wherein the control device is configured to drive the different signal terminals of the respectively assigned Hall effect components according to the spinning current principle or the spinning voltage principle.

19. The Hall effect sensor arrangement as claimed in claim 17, wherein the control device is configured to eliminate the detected measurement signals with respect to the magnetic field components in the first and second detection directions.

20. The Hall effect sensor arrangement as claimed in claim 17, which furthermore comprises an evaluation device, wherein the evaluation device is designed to evaluate the measurement signals provided by the control device with respect to the instantaneously present magnetic field components in the first and second detection directions.

21. The Hall effect sensor arrangement as claimed in claim 20, wherein the evaluation device is designed to carry out a linear combination of the measurement signals obtained in the different operating phases.

22. A Hall effect sensor arrangement, comprising the following features:
   a first Hall effect component, which is formed by a first electrically conductive region extending into a substrate perpendicularly to the surface of the substrate and has a plurality of terminal regions along a side face at the surface of the substrate,
   at least one second, identically constructed Hall effect component interconnected with the first Hall effect component, such that during operation of the Hall effect sensor arrangement with a spinning current technique and an identical control current in the different spinning current operating phases, in each spinning current operating phase a same combination of control current distributions is obtained in the Hall effect sensor arrangement, wherein the first Hall effect component and the second Hall effect component each have 2×b, where b>2, contact terminals; and
   a control device which is couplable to the contact terminals of the first and second Hall effect components such that during the different spinning current operating phases of successive spinning current operating cycles the four contact terminals are each active alternately in pairs as control terminals and measurement terminals,
   wherein the control device is furthermore designed, during at least one (predefined) spinning current operating phase in each respective m-th (where m=1 to 1000) successive operating cycle, to drive the respective pairs of control and measurement terminals such that during these predefined spinning current operating phases the respective current flow through the control terminals is different, and the resultant additional current flows through the measurement terminals are nominally identical.

23. The Hall effect sensor arrangement as claimed in claim 22, wherein during the at least one predefined spinning current operating phase nominally identical currents flow via an integral number of measurement terminals.

24. The Hall effect sensor arrangement as claimed in claim 22, wherein a first current flows via a first measurement terminal in a first spinning current operating phase and a second current flows via a first measurement terminal in a second spinning current operating phase, wherein the second spinning current operating phase has an inverted supply signal polarity relative to the first spinning current operating phase.

25. The Hall effect sensor arrangement as claimed in claim 24, wherein the control device is designed to obtain an inversion of the supply signal polarity by a changeover between the potentials at the positive and negative supply terminals.

26. The Hall effect sensor arrangement as claimed in claim 22, wherein the two Hall effect components respond to magnetic field components which are parallel with respect to the substrate surface.

27. The Hall effect sensor arrangement as claimed in claim 22, wherein the two Hall effect components respond to magnetic field components which are perpendicular with respect to the substrate surface.

* * * * *